(12) United States Patent
Chen et al.

(10) Patent No.: US 9,160,326 B2
(45) Date of Patent: Oct. 13, 2015

(54) GATE PROTECTED SEMICONDUCTOR DEVICES

(71) Applicant: The Hong Kong University of Science and Technology, Hong Kong (CN)

(72) Inventors: Jing Chen, Kowloon (HK); Man Ho Kwan, Kowloon (HK)

(73) Assignee: The Hong Kong University of Science and Technology, Kowloon (HK)

( * ) Notice: Subject to any disclaimer, the term of this patent is extended or adjusted under 35 U.S.C. 154(b) by 4 days.

(21) Appl. No.: 13/936,386

(22) Filed: Jul. 8, 2013

(65) Prior Publication Data

US 2014/0015591 A1    Jan. 16, 2014

Related U.S. Application Data

(60) Provisional application No. 61/690,984, filed on Jul. 10, 2012.

(51) Int. Cl.
*H03K 17/081* (2006.01)
*H01L 27/095* (2006.01)
*H01L 21/8252* (2006.01)
*H01L 27/06* (2006.01)

(52) U.S. Cl.
CPC ...... *H03K 17/08104* (2013.01); *H01L 21/8252* (2013.01); *H01L 27/0605* (2013.01); *H01L 27/095* (2013.01)

(58) Field of Classification Search
CPC ............... H01L 29/7786; H01L 29/42316; H01L 29/2003; H01L 27/0605; H01L 27/095
USPC ........... 257/194, 195, 76, 77, 191, E21.403, 257/272
See application file for complete search history.

(56) References Cited

U.S. PATENT DOCUMENTS

| 6,864,510 | B2 | 3/2005 | Youn et al. |
| 7,459,356 | B1 | 12/2008 | Smart et al. |
| 7,968,391 | B1 | 6/2011 | Smart et al. |
| 2001/0034116 | A1 | 10/2001 | Lee et al. |
| 2002/0177261 | A1* | 11/2002 | Song ............................ 438/167 |

(Continued)

FOREIGN PATENT DOCUMENTS

EP    2503691 A1    9/2012

OTHER PUBLICATIONS

Kwan, et al., "Integrated Gate-protected HEMTs and Mixed-Signal Functional Blocks for GaN Smart Power ICs," Electron Devices Meeting (IEDM), 2012 IEEE International, Dec. 10-13, 2012, pp. 7.3.1-7.3.4.

(Continued)

*Primary Examiner* — Kenneth Parker
*Assistant Examiner* — Bo Fan
(74) *Attorney, Agent, or Firm* — Amin, Turocy & Watson, LLP

(57) ABSTRACT

Providing gate protection to a group III-semiconductor device by delivering gate overdrive immunity is described herein. The gate protection can be achieved by embedding a gate-voltage-controlling second transistor to the gate electrode of a first transistor. In other words, a first gate electrode of the first semiconductor device is in series with a second source electrode of the second semiconductor device, and a second gate electrode of the second semiconductor device is connected to the second source electrode and the first gate electrode.

17 Claims, 22 Drawing Sheets

(56) References Cited

U.S. PATENT DOCUMENTS

| | | | |
|---|---|---|---|
| 2007/0228416 A1* | 10/2007 | Chen et al. | 257/192 |
| 2009/0032820 A1* | 2/2009 | Chen | 257/76 |
| 2009/0189190 A1 | 7/2009 | Hashimoto et al. | |
| 2011/0018002 A1 | 1/2011 | Chen et al. | |
| 2012/0236449 A1 | 9/2012 | Ping et al. | |

OTHER PUBLICATIONS

Ma, et al., "Reliability of Enhancement-mode AlGaN/GaN HEMTs Under ON-State Gate Overdrive," Electron Devices Meeting (IEDM), 2010 IEEE International, Dec. 6-8, 2010, pp. 20.4.1-20.4.4.

Ma, et al., "ON-state critical gate overdrive voltage for fluorine-implanted enhancement-mode AlGaN/GaN high electron mobility transistors," Journal of Applied Physics 110, 114514 (2011), Dec. 7, 2011, 8 pages.

Zhou, et al., "Schottky-Ohmic Drain AlGaN/GaN Normally Off HEMT With Reverse Drain Blocking Capability," IEEE Electron Device Letters, vol. 31, No. 7, Jul. 2010, pp. 668-670.

T. Uesugi, et al. "GaN Power Switching Devices for Automotive Applications," 2009 Int. Conf. on Compound Semiconductor Manufacturing Technology (CS Matech'09), May 18-21, 2009, 4 pages.

Wong, et al. "Wide Bandgap GaN Smart Power Chip Technology," 2009 Int. Conf. on Compound Semiconductor Manufacturing Technology (CS Matech'09), May 18-21, 2009, 4 pages.

Wong, et al. "GaN Smart Power IC Technology," Phys. Sta. Sol. (b), 247, No. 7, pp. 1732-1734, 2010.

Chen, et al. "Monolithic integration of lateral field-effect rectifier with normally-off HEMT for GaN-on-Si switch-mode power supply converters", in IEDM Tech. Dig., 2008, pp. 141-144, Dec. 15-17, 2008.

Chen, et al. "High-performance AlGaN/GaN lateral field-effect rectifiers compatible with high electron mobility transistors", Appl. Phys. Lett., vol. 92, pp. 253-501, 2008.

Chen, et al. "Single-Chip Boost Converter Using Monolithically Integrated AlGaN/GaN Lateral Field-Effect Rectifier and Normally-Off HEMT", IEEE Electron Devices Letters, vol. 30, pp. 430-432, 2009.

Wong, et al. "Integrated Voltage Reference Generator for GaN Smart Power Chip Technology", IEEE Trans. Electron Devices, vol. 57, No. 4, pp. 952-955, Apr. 2010.

Kwan, et al. "High-Gain and High-Bandwidth AlGaN/GaN High Electron Mobility Transistor Comparator with High-Temperature Operation", Jap. J. Applied Phys., vol. 50, No. 04DF02, 04DF02-1-04DF02-4, 2011.

Liu, et al. "GaN Single-Polarity Power Supply Bootstrapped Comparator for High Temperature Electronics," IEEE Electron Device Letters, vol. 32, No. 1, pp. 27-29, Jan. 2011.

Cai, et al. "Control of Threshold Voltage of AlGaN/GaN HEMTs by Fluoride-based Plasma Treatment: From Depletion Mode to Enhancement Mode", IEEE Trans. Electron Devices, vol. 53, No. 9, pp. 2207-2215, Sep. 2006.

Cai, et al. "High-performance enhancement-mode AlGaN/GaN HEMTs using fluoride-based plasma treatment", IEEE Electron Devices Letters, vol. 26, No. 7, pp. 435-437, Jul. 2005.

Palacios, et al. "High-performance E-mode AlGaN/GaN HEMTs", IEEE Electron Device Lett., vol. 27, No. 6, pp. 428-430, Jun. 2006.

* cited by examiner

GATE PROTECTED SEMICONDUCTOR DEVICES

CROSS REFERENCE TO RELATED APPLICATION

This application claims priority to U.S. provisional application No. 61/690,984, filed on Jul. 10, 2012 and entitled: "Integrated III-nitride gate-protected HEMTs with gate overdrive immunity." The entirety of this provisional application is incorporated herein by reference.

TECHNICAL FIELD

This disclosure generally relates to providing gate overdrive protection to a semiconductor device by embedding a gate-voltage-controlling transistor to the gate electrode of the semiconductor device.

BACKGROUND

Group III-nitride (also referred to as III-nitride or III-N) heterojunction devices can deliver advantageous properties compared to their silicon and gallium arsenic counterparts for power switch applications. The advantageous properties include, but are not limited to, a wide bandgap, a high breakdown electric field, a capability of high-temperature operation and a large thermal conductivity. A wide-bandgap group III-nitride heterostructure device can yield a two-dimensional electron gas (2DEG) channel with a high sheet charge concentration and high electron mobility. Accordingly, group III-nitride devices (e.g. GaN-based heterostructure devices, such as those incorporating AlGaN/GaN heterostructure) have emerged as attractive candidates for high-efficiency, high voltage power driving systems and power converters.

To improve functionality and enhance reliability of these power driving systems and power converters, it is desirable to accommodate not only the high-voltage core power devices, but also the low-voltage peripheral devices that are monolithically integrated on the same group III-nitride for building mixed-signal (e.g., sensing/control/protection) driver circuits.

To turn on a high-voltage core power device, such as high electron mobility transistor (HEMT), its Schottky gate electrode is usually slightly over-driven by the driver circuit to minimize on-resistance and maximize output current. In this way, due to exponential current-voltage relationship of the Schottky gate, overdriving gate voltage of the power device will lead to over-current that result in gate failure. Moreover, in an enhancement-mode HEMT (E-HEMT) that is realized with fluorine plasma-implant technology, the overdrive gate voltage bias beyond the critical voltage (for example, around 2.5V) may introduce threshold voltage instability of the device. Therefore, a gate overdrive protection is necessary to achieve both gate current gate voltage limitations.

Currently, gate voltage limiting and transient voltage suppression (TVS) can be achieved with silicon Zener diodes. For group III-nitride based transistors, however, Zener diodes must be connected off-chip, which requires space for large wire-bond pads. Off-chip connection with wire-bonds limits the switching speed of the power devices. Zener diodes cannot be fabricated on the group III-nitride hetero-structure because the wide-bandgap group III-nitride materials are difficult to be doped heavily, which is needed to accommodate Zener breakdown voltage down to the ON-state critical Schottky gate voltage of group III-nitride power transistors (e.g., a typical value of about 2.5V).

The above-described background is merely intended to provide an overview of contextual information regarding group-III nitride heterojunction devices, and is not intended to be exhaustive. Additional context may become apparent upon review of one or more of the various non-limiting embodiments of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate any scope of particular embodiments of the specification, or any scope of the claims. Its sole purpose is to present some concepts of the specification in a simplified form as a prelude to the more detailed description that is presented later.

In accordance with one or more embodiments and corresponding disclosure, various non-limiting aspects are described in connection with providing semiconductor devices (e.g., group III-nitride semiconductor devices) with integrated gate overdrive immunity (e.g., via an integrated overdrive protection circuit formed in the same group III-nitride semiconductor material). The semiconductor devices with integrated gate overdrive immunity can achieve at least: robust gate protection towards high gate drive voltages and against accidental voltage surge appeared at the gate input; and improved ON-state reliability with no shift of threshold voltage. Accordingly, the semiconductor devices with integrated gate overdrive immunity are capable of operation at gate voltage inputs with accidental high voltage surge, high temperatures, in noisy environments, and with enhanced robustness or intelligence.

The semiconductor devices with integrated gate overdrive immunity are particularly advantageous for compact and/or high-efficiency power converters with corresponding mixed-signal sense/protection/control functional blocks to improve functionality and reliability of power devices. Example uses for the semiconductor devices with integrated overdrive immunity include, but are not limited to, motor drive circuits, audio amplifiers, local interface to combustion engines, various aerospace applications, down-hole electronics in oil and gas wells, and the like.

In an embodiment, an integrated group III-nitride device is described. The integrated group III-nitride device includes a first semiconductor structure comprising a first source electrode, a first drain electrode and a first gate electrode; and a second semiconductor structure comprising a second source electrode, a second drain electrode and a second gate electrode. The first gate electrode is in series with the second source electrode, and the second gate electrode is connected to the second source electrode and the first gate electrode.

The second semiconductor structure can be smaller than the first semiconductor structure. One or more of the semiconductor structures can be group III-nitride semiconductor device. For example, the first semiconductor structure can be an enhancement-mode high electron mobility transistor (E-HEMT), a depletion-mode high electron mobility transistor (D-HEMT), or the like, while the second semiconductor structure can be a D-HEMT. The semiconductor devices can be formed on the same substrate.

An input bias voltage can be applied to the second drain electrode of the second semiconductor structure. In response to the input bias voltage value being less than a defined voltage value, the second semiconductor structure shows small resistance with very small voltage drop and the input bias voltage essentially drives a gate voltage of the first semiconductor structure. In response to the input bias voltage value being greater than or equal to the defined voltage value, the current at the first gate is clamped by the saturation current of the second semiconductor structure and the gate voltage of the first semiconductor structure is clamped at a value less than the defined voltage value.

In another embodiment, a method is described. The method includes connecting a first gate electrode of a first semiconductor structure and a second source electrode of a second semiconductor structure in series. The first semiconductor structure comprises the first source electrode, a first drain electrode, and the first gate electrode. The second semiconductor structure comprises the second source electrode, a second drain electrode and a second gate electrode. The method also includes connecting the second gate electrode to the second source electrode and the first gate electrode. A bias voltage is applied to the second drain electrode; and the first gate electrode of the first semiconductor structure can be prevented from reaching an overdrive potential when the bias voltage value is greater than or equal to a defined value.

Gate overdrive protection is achieved due to the second semiconductor device. The second semiconductor device can act as a variable resistor based on the input bias voltage to facilitate preventing the first gate electrode of the first semiconductor structure from reaching the overdrive potential. For example, the protection can include clamping a current at the first gate electrode at a saturation current of the second semiconductor structure such that a gate voltage of the first semiconductor structure is clamped at a value less than the predefined voltage value. When the input bias voltage value is less than the defined voltage, the gate voltage of the first semiconductor device can be driven by the input bias voltage. The predefined value can be a value of voltage that corresponds to a current of the first gate electrode for safe and stable operation, and this defines a saturation current of the second semiconductor device. For example, the predefined value can be about 2.5 Volts. To achieve that saturation current, either the dimension of second semiconductor device is designed, or an external bias is applied between the second gate and the second source electrodes.

The first semiconductor structure can include a first vertical layered heterostructure and the second semiconductor structure can include a second vertical layered heterostructure. The first vertical layered heterostructure and the second vertical layered heterostructure can be the same vertical layered heterostructure (e.g., implemented on a same group-III nitride semiconductor material).

In a further embodiment, a device is described. The device includes a first semiconductor structure and a second semiconductor structure. The first semiconductor structure includes a first source electrode, a first drain electrode and a first gate electrode; and the second semiconductor structure includes a second source electrode, a second drain electrode and a second gate electrode. The first gate electrode is in series with the second source electrode, and the second gate electrode is connected to the second source electrode and the first gate electrode. The second gate electrode has a Schottky barrier structure. The Schottky barrier structure can include a Schottky barrier contact and a negative charge-trapped region on the second semiconductor substrate. The negative charge-trapped region can include negative ions, including, for example, $F^-$ ions.

The second semiconductor structure can be smaller than the first semiconductor structure. The semiconductor devices can be implemented on the same substrate material (e.g., a group III-nitride semiconductor substrate material). The device can include an isolation structure that separates the first semiconductor structure and the second semiconductor structure.

The following description and the drawings set forth certain illustrative aspects of the specification. These aspects are indicative, however, of but a few of the various ways in which the various embodiments of the specification may be employed. Other aspects of the specification will become apparent from the following detailed description of the specification when considered in conjunction with the drawings.

BRIEF DESCRIPTION OF THE DRAWINGS

Numerous aspects and embodiments are set forth in the following detailed description, taken in conjunction with the accompanying drawings, in which like reference characters refer to like parts throughout, and in which.

DETAILED DESCRIPTION

Figure 1:
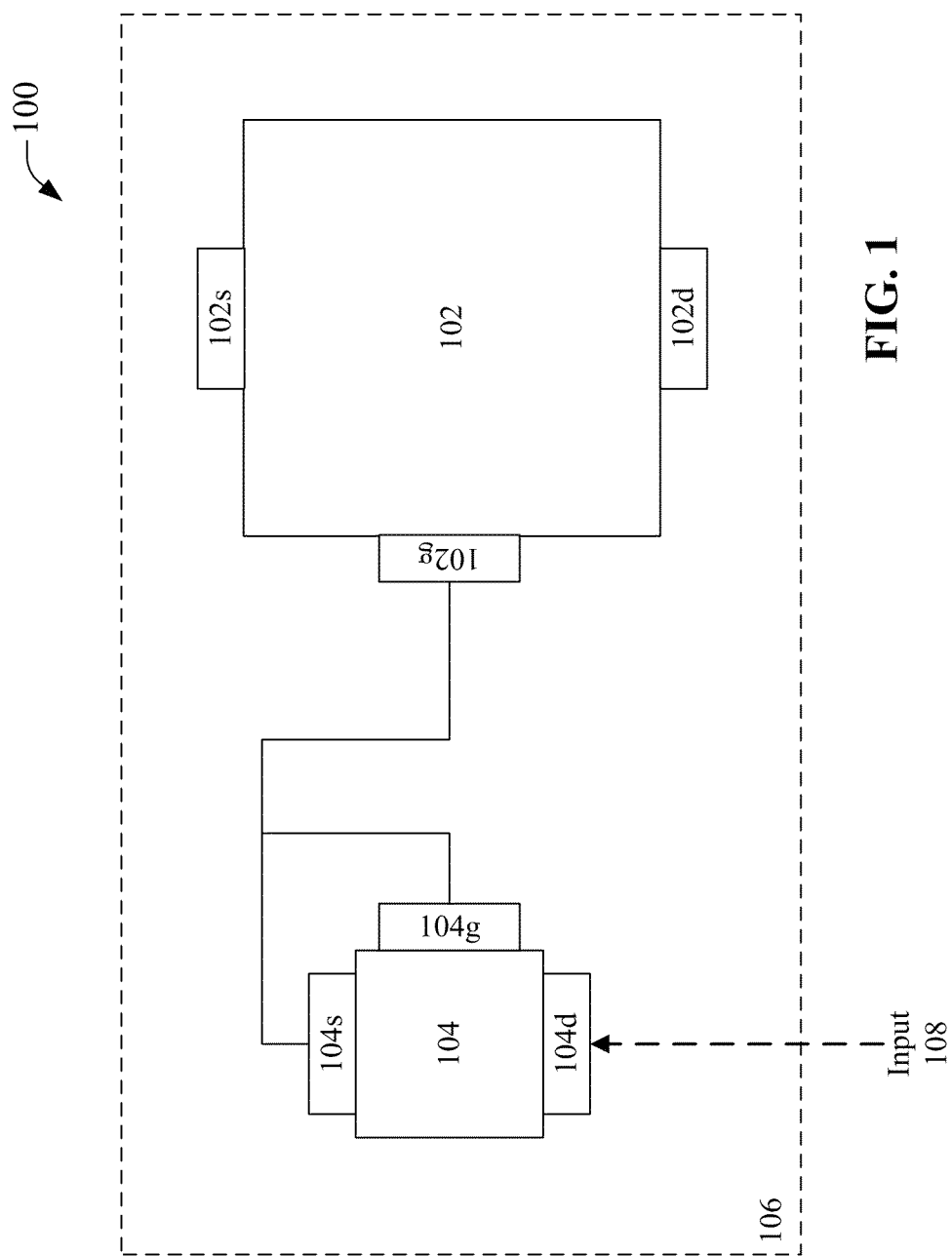
FIG. 1 is an example non-limiting schematic diagram of a system that facilitates protection of a semiconductor device from overdrive, according to an aspect or embodiment of the subject disclosure.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that the certain aspects of disclosure may be practiced without these specific details, or with other methods, components, molecules, etc. In other instances, well-known structures and devices are shown in block diagram form to facilitate description and illustration of the various embodiments. Additionally, elements in the drawing figures are not necessarily drawn to scale; some areas or elements may be expanded to help improve understanding of certain aspects or embodiments.

The subject application is generally related to an embedded gate-voltage-controlling transistor to a gate electrode of a semiconductor device to provide gate overdrive protection to a semiconductor device by embedding a gate-voltage-controlling transistor to the gate electrode of the semiconductor device. The systems and methods that can facilitate gate overdrive protection can deliver at least ON-state safe operation, gate voltage surge protection and gate current limitation, while providing on-chip integration compatible with HEMT-processing without requiring extra photo mask or process steps.

The gate overdrive immunity can be provided by a gate-source connected (or tied up) D-HEMT that can be embedded into the gate of a semiconductor device (e.g., E-HEMT or D-HEMT). The device width of the embedded a gate-source tied up D-HEMT can be easily tuned such that the limiting voltage is just below the critical ON-state gate voltage of the semiconductor device (e.g., a group III-nitride power transistor). The gate overdrive immunity can be provided for devices with high switching frequency, including unipolar transistors and rectifiers.

As an example, group III-nitride power converters (e.g., GaN power converters) are described to facilitate the understanding of the voltage control described herein. It will be understood, however, that other high power semiconductor device can achieve overdrive protection through the systems and methods described herein.

To realize robust group III-nitride power converters, a fully integrated smart power platform has been proposed. The smart power platform can accommodate not only the high-voltage core power components of the platform, but also peripheral devices for mixed-signal functional blocks. In such a platform, various sensing/control/protection schemes can be developed to enhance circuit functionalities, but it is also equally important to improve the device reliability. For example, the reliability issue due to the overdrive gate voltage bias needs to be addressed. The reliability issue can be addressed by embedding a gate-voltage-controlling depletion mode HEMT (D-HEMT) into a gate electrode of a semiconductor device.

Figure 2:
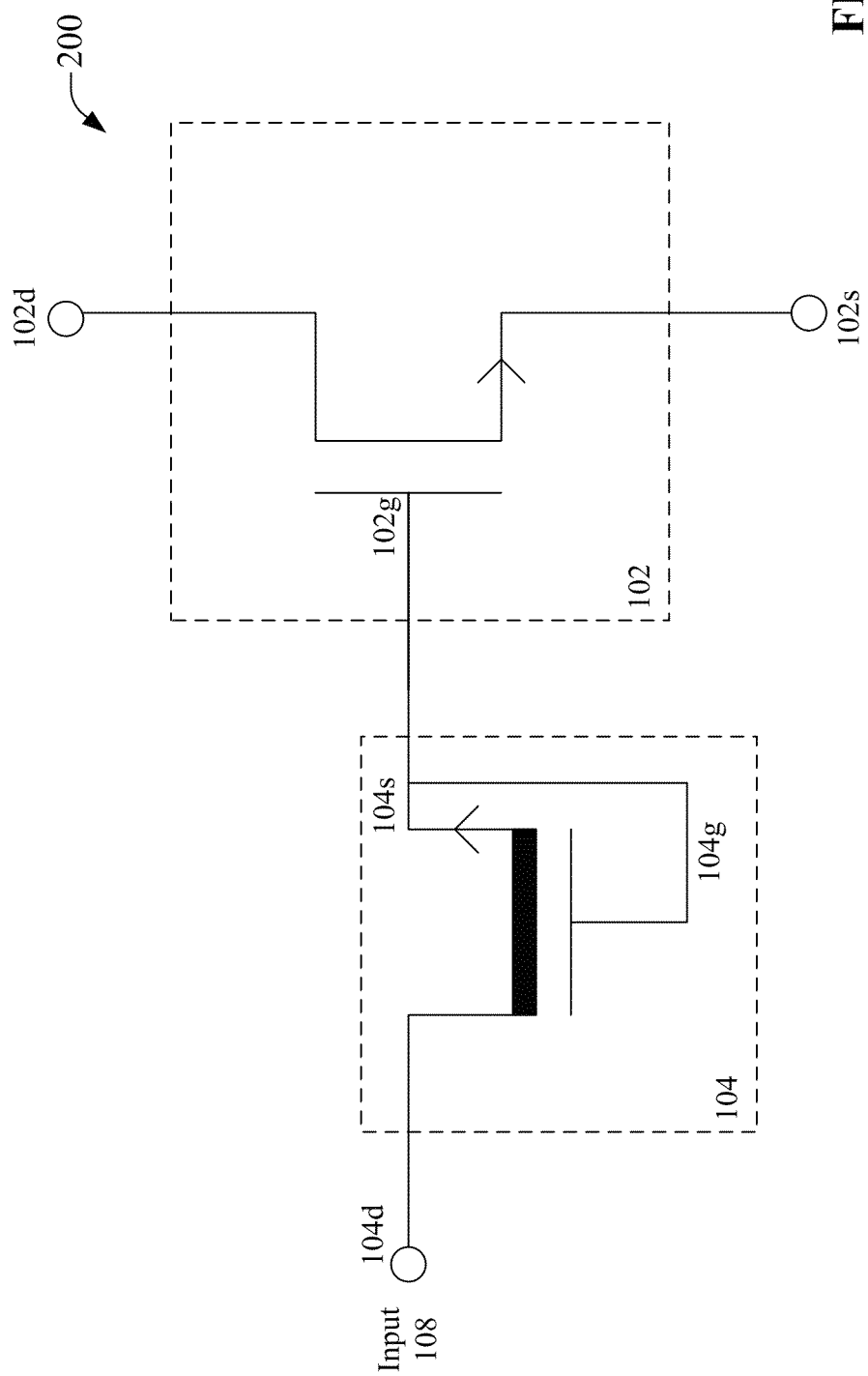
FIG. 2 is an example non-limiting schematic circuit diagram of a system that facilitates protection of a semiconductor device from overdrive, according to an aspect or embodiment of the subject disclosure.

Referring now to FIG. 1, illustrated is an example non-limiting schematic diagram of a system 100 that facilitates protection of a semiconductor device 102 from overdrive. A circuit diagram 200 of the system 100 of FIG. 1 is shown in FIG. 2. System 100 can include two semiconductor devices 102, 104. In this illustration, semiconductor device 102 is the gate overdrive protected device and semiconductor device 104 facilitates the overdrive protection. It will be understood that system 100 can include more than one semiconductor device 102. System 100 can also include more than one semiconductor device 104, but, in its simplest form, the overdrive control need only be achieved with a single semiconductor device 104.

Semiconductor device 102 includes a source electrode 102s, a gate electrode 102g and a drain electrode 102d. Similarly, semiconductor device 104 includes a source electrode 104s, a gate electrode 104g, and a drain electrode 104d. Semiconductor device 104 can be referred to as a "bootstrapped" device that is "tied up" such that the gate electrode 104g and the source electrode 104s are connected. Semiconductor 104 (e.g., source 104s) is embedded in the gate 102g of semiconductor 102 to facilitate the gate overdrive protection. In other words, the gate electrode 102s is connected to the gate electrode 102g and the source electrode 102s.

The source and drain electrodes 102s, 102d, 104s and/or 104d can make Ohmic contacts to their respective semiconductor 102 or 104. The gate electrodes 102g and/or 104g can make Schottky barrier contacts to their respective semiconductor 102 or 104.

An input bias voltage 108 (or forward input bias) can be input to the drain electrode 104d of the first semiconductor device. The bootstrapped semiconductor device 104 acts as a variable resistor in response to the input bias voltage 108. When the input bias voltage 108 is below a critical value (a voltage value at which semiconductor device 102 has safe and reliable operation), the current at the gate 102g of semiconductor 102 is below the saturation current of the bootstrapped semiconductor 104. In turn, the bootstrapped semiconductor device 104 exhibits low resistance such that the input bias voltage 108 can directly drive semiconductor device 102. When the input bias voltage 108 is above the critical value, the gate current of the gate electrode 102g is clamped by the saturation current of device 104 of the bootstrapped semiconductor device 104. Accordingly, the bootstrapped semiconductor device 104 exhibits a very large resistance. Once the gate saturation current is reached, any increase in input bias voltage 108 will be absorbed by the bootstrapped semiconductor device 104, allowing the gate voltage of semiconductor device 102 to be maintained just below the critical value. Thus, the gate electrode 102g of semiconductor device 102 is guaranteed to be reliable and in safe operation. Limiting the gate voltage of semiconductor device 102 below the critical value can easily be achieved by adjusting the channel width of the bootstrapped semiconductor device 104.

The bootstrapped semiconductor device 104 can be smaller than the semiconductor device 102. When the bootstrapped semiconductor device 104 is small compared to the semiconductor device 102, the bootstrapped semiconductor device does not cause a significant increase of the active device area and the corresponding specific on-resistance. Both semiconductor 102 and semiconductor 104 can be implemented on the same semiconductor materials. For example, the semiconductor materials can be group III-nitride semiconductor materials.

In an embodiment, the bootstrapped semiconductor device 104 can be a bootstrapped depletion-mode high electron mobility transistor (D-mode HEMT, DHEMT, D-HEMT, or the like). The semiconductor device 102 can be any semiconductor device. For example, semiconductor device 102 can be a bipolar transistor, a unipolar transistor or a rectifier. In an embodiment, semiconductor device 102 can be an enhancement-mode HEMT (E-mode HEMT, EHEMT, E-HEMT, or the like). In another embodiment, semiconductor device 102 can be a depletion-mode HEMT (D-mode HEMT, DHEMT, D-HEMT, or the like).

Figure 3:
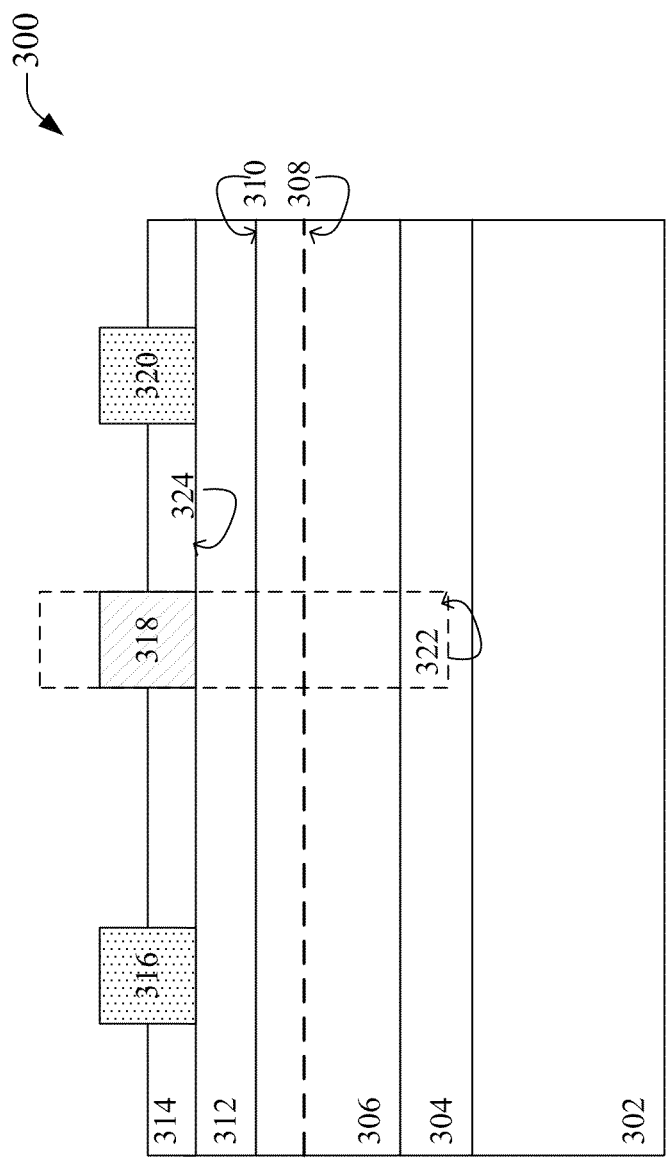
FIG. 3 is an example non-limiting schematic cross-section of a depletion-mode high electron mobility transistor (D-HEMT) semiconductor device, according to an aspect or embodiment of the subject disclosure.

FIG. 3 is an example non-limiting schematic cross-section of a depletion-mode high electron mobility transistor (D-HEMT) semiconductor device 300. As described herein, the device 300 is a group III-nitride semiconductor device. It will be appreciated that the device can be any other type of semiconductor device.

The device 300 includes a nitride material buffer layer 304 that is formed on a substrate layer 302. The substrate layer 302 can be made, for example, of Si, SiC, Sapphire or GaN. A nitride semiconductor channel layer 306, such as, for example, GaN, is formed on the buffer layer 304. A nitride semiconductor barrier layer 312, such as, for example, $Al_xGa_{1-x}N$ ($0<X\leq1$), is formed on the semiconductor layer 306. A passivation or protection layer 314, such as, for example, SiN, is formed on the semiconductor barrier layer 312.

A polarization charge is generated by spontaneous and piezoelectric polarization of the nitride semiconductor material, at an interface 310 at the boundary between semiconductor layer 306 and semiconductor barrier layer 312. As a result of the polarization charge, a two dimensional electron gas (2DEG) 308 forms in the vicinity between semiconductor 306 and semiconductor barrier layer 312.

Drain electrode 316, gate electrode 318, and source electrode 320 are formed on the primary surface 324 of semiconductor barrier layer 312. For source electrode 316 and drain electrode 320, an Ohmic contact is formed to the underlying semiconductor barrier layer 312 (and hence underlying 2DEG 308), such as by metal stack Ti/Al/Ni/Au (or Ti/Al/Ti/Au, or the like) and thermal annealing. For gate electrode 318, a Schottky contact is formed to the underlying semiconductor barrier layer 318, such as by metal stack Ni/Au. A normally-on region 322 is formed, including Schottky contact electrode 318, semiconductor barrier layer 312 and semiconductor channel layer 306, which locate directly under the Schottky contact electrode 318. In the normally-on section 322, the 2DEG 310 exists.

Figure 4:
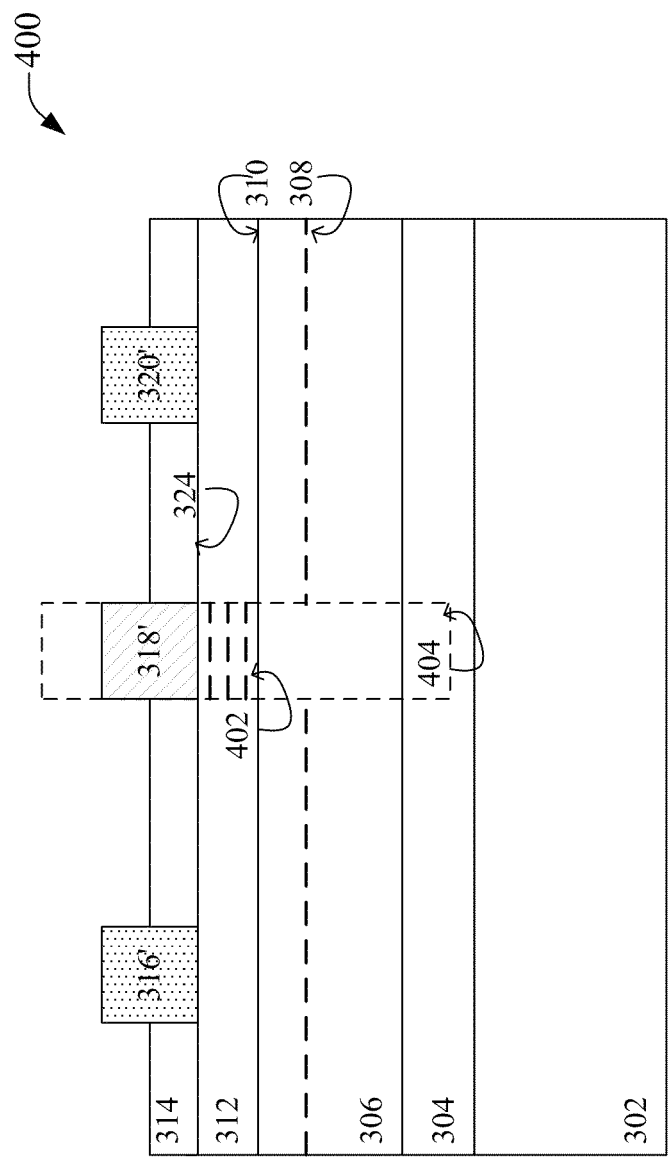
FIG. 4 is an example non-limiting schematic cross-section of an enhancement-mode high electron mobility transistor (E-HEMT) semiconductor device, according to an aspect or embodiment of the subject disclosure.

FIG. 4 is an example non-limiting schematic cross-section of an enhancement-mode high electron mobility transistor (E-HEMT) semiconductor device 400. Device 400 has a similar device structure to that of device 300. A major difference between device 400 and device 300 is that, in the semiconductor barrier layer 312 and underneath the gate electrode 318' is a region 402 containing permanently negatively charged ions, generally fluorine ions (F−) which have been introduced by fluorine plasma implant technology. Region 402 may also extend into the semiconductor channel layer 306. Details of F− implantation are described in U.S. patent application Ser. No. 11/564,766, publication number US 2007/0278518, which is hereby incorporated by reference in its entirety.

A normally-off region 404 is formed, including Schottky contact electrode 318', semiconductor barrier layer 312 and semiconductor channel layer 306, which are located directly under the Schottky contact electrode 318', and region 402 containing permanently negatively charged ions. In the normally-off region 404, the 2DEG does not exist. The 2DEG is depleted by the negative charges region 402, providing device 400 with E-mode operation.

Low specific on-resistance ($R_{ON, SP}$) are desirable in high-voltage power HEMTs, e.g. in switching-mode power supplies and power factor correction circuits, and low-voltage peripheral HEMTs, e.g. in mix-signal driving circuits. For conventional HEMTs 300 and 400, when the transistor is turned on as a switch, the Schottky contact electrode 318 or 318' is usually switched to a value near or slightly beyond the forward turn-on voltage to obtain the minimum on-resistance. Due to the exponential current-voltage relationship ($I_G$–$V_{GS}$ of HEMT 400 in FIG. 15) beyond the forward turn-on voltage, small increases in the forward bias could result in excessive gate current that may lead to device failure. A recent study also reveals that the driving gate of a group III-nitride HEMT fabricated by the fluorine plasma implant technology above certain critical values could result in negative shift in the threshold voltage and should be avoided.

Figure 5:
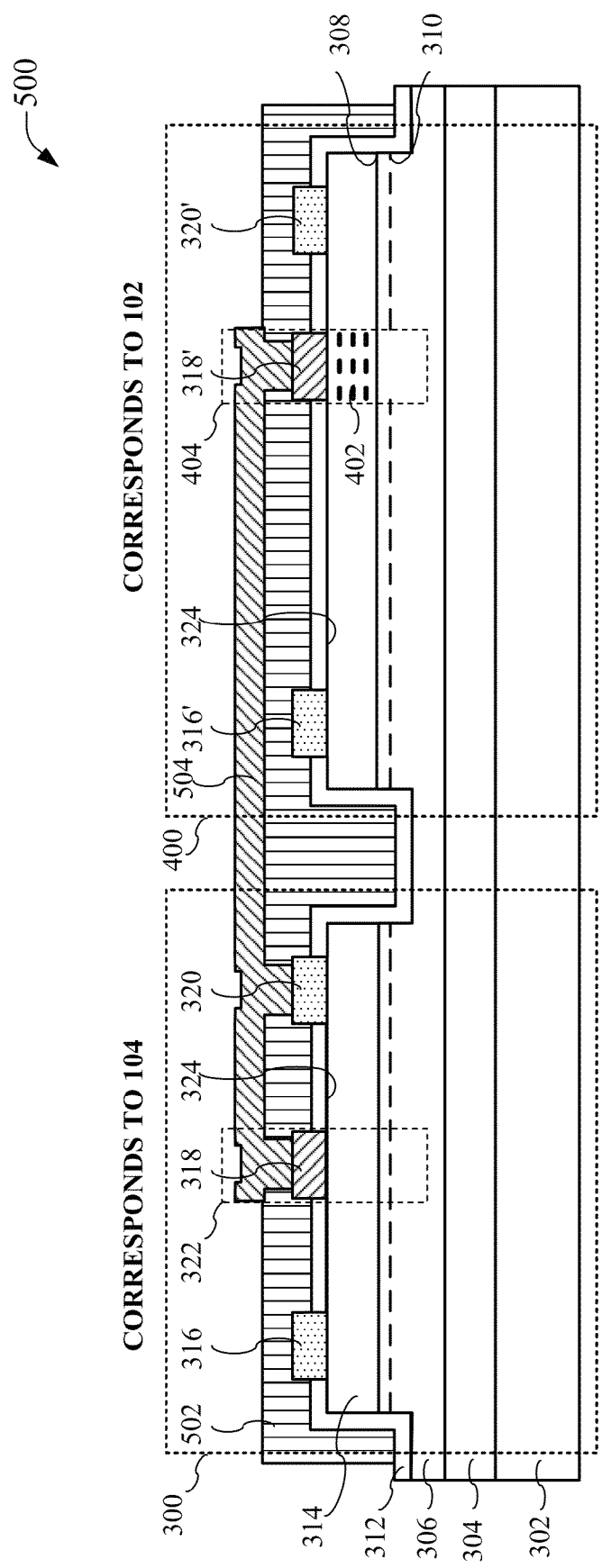
FIG. 5 is an example non-limiting schematic cross-section of a system employing the system illustrated in the circuit diagram of FIG. 2, according to an aspect or embodiment of the subject disclosure.

FIG. 5 is an example non-limiting schematic cross-section 500 of a system 500 illustrated in the schematic diagram 100 of FIG. 1 and the circuit diagram 200 of FIG. 2. FIG. 5 employs the gate overdrive protection scheme 200 that delivers safe operation and improved reliability. A nitride material buffer layer 304 is formed on a substrate layer 302. The substrate layer 302 can be made of Si, SiC, Sapphire or GaN. A nitride semiconductor channel layer 306, such as GaN, is formed on the buffer layer 304. A nitride semiconductor barrier layer 314, such as $Al_xGa_{1-x}N$ ($0<X\leq1$), is formed on the semiconductor layer 306. A passivation or protection layer 312, such as SiN, is formed on the semiconductor barrier layer 314.

A polarization charge is generated by spontaneous and piezoelectric polarization of the nitride semiconductor material, at an interface 308 at the boundary between semiconductor layer 306 and semiconductor barrier layer 314. As a result of the polarization charge, a two dimensional electron gas (2DEG) 402 forms in the vicinity between semiconductor layer 306 and semiconductor barrier layer 314.

Drain Ohmic contacts 316 and 316', source Ohmic contacts 320 and 320', along with the gate electrodes 318 and 318', are formed on the primary surface 324 of semiconductor barrier layer 312. For the Ohmic contact electrode, an Ohmic contact is formed to the underlying semiconductor barrier layer 314 (and, hence, underlying 2DEG 310), such as by metal stack Ti/Al/Ni/Au (or Ti/Al/Ti/Au, or the like) and thermal annealing. For the Schottky contact electrode, a Schottky contact is formed on the primary surface 324 of semiconductor barrier layer 314, such as by metal stack Ni/Au. In the semiconductor barrier layer 314 and underneath the Schottky contact electrode 318' is a region 402 containing permanently negatively charged ions, generally fluorine ions (F⁻) which have been introduced by fluorine plasma implantation technique. Under the Schottky contact electrode 318', the 2DEG is depleted by the negative charges region 402, providing device 102 with E-mode operation and forming a normally-off channel section. Under the Schottky contact electrode 318 of the region 322, the 2DEG exists, forming a normally-on channel section.

Electrical insulation layer 502, such as by polyimide, is formed on top of layer 312. Interconnect metal 504, such as by metal stack Ni/Au (or Au, or the like), is formed on top of the insulation layer 502 for connecting the electrodes 320, 318 and 318' electrically in the same way as the circuit in FIG. 2

Figure 6:
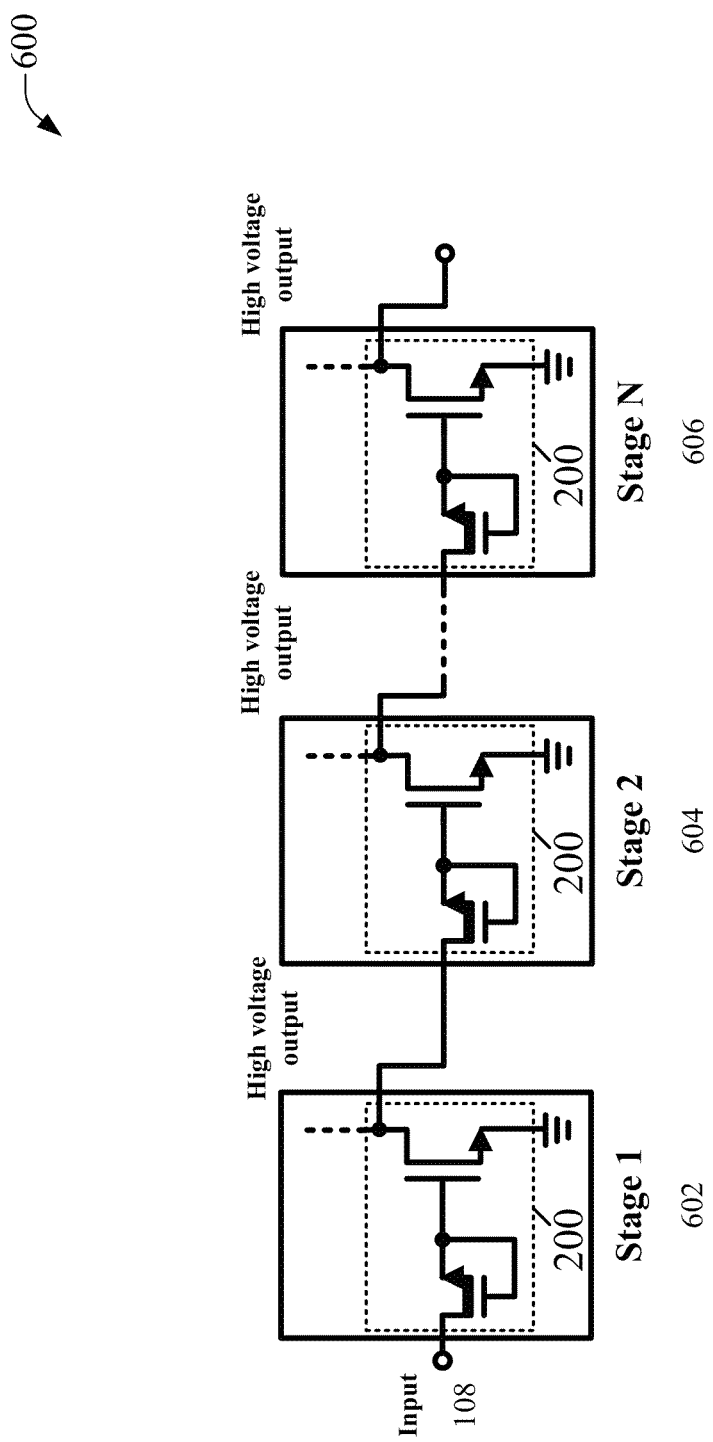
FIG. 6 is an example non-limiting schematic diagram that illustrates a cascade of stages that have high voltage outputs, according to an aspect or embodiment of the subject disclosure.

Referring now to FIG. 6, illustrated is an example non-limiting schematic diagram 600 that illustrates a cascade of stages 602, 604, 606 that have high voltage outputs. Due to the wide input bias range using the gate-protection technique, the cascade of high voltage output stages 602, 604, 606 can each include a gate protection circuit 200. It will be understood that FIG. 6 is merely an example of a possibility of use of the gate protection circuit, and is not intended to be limiting.

Figure 7:
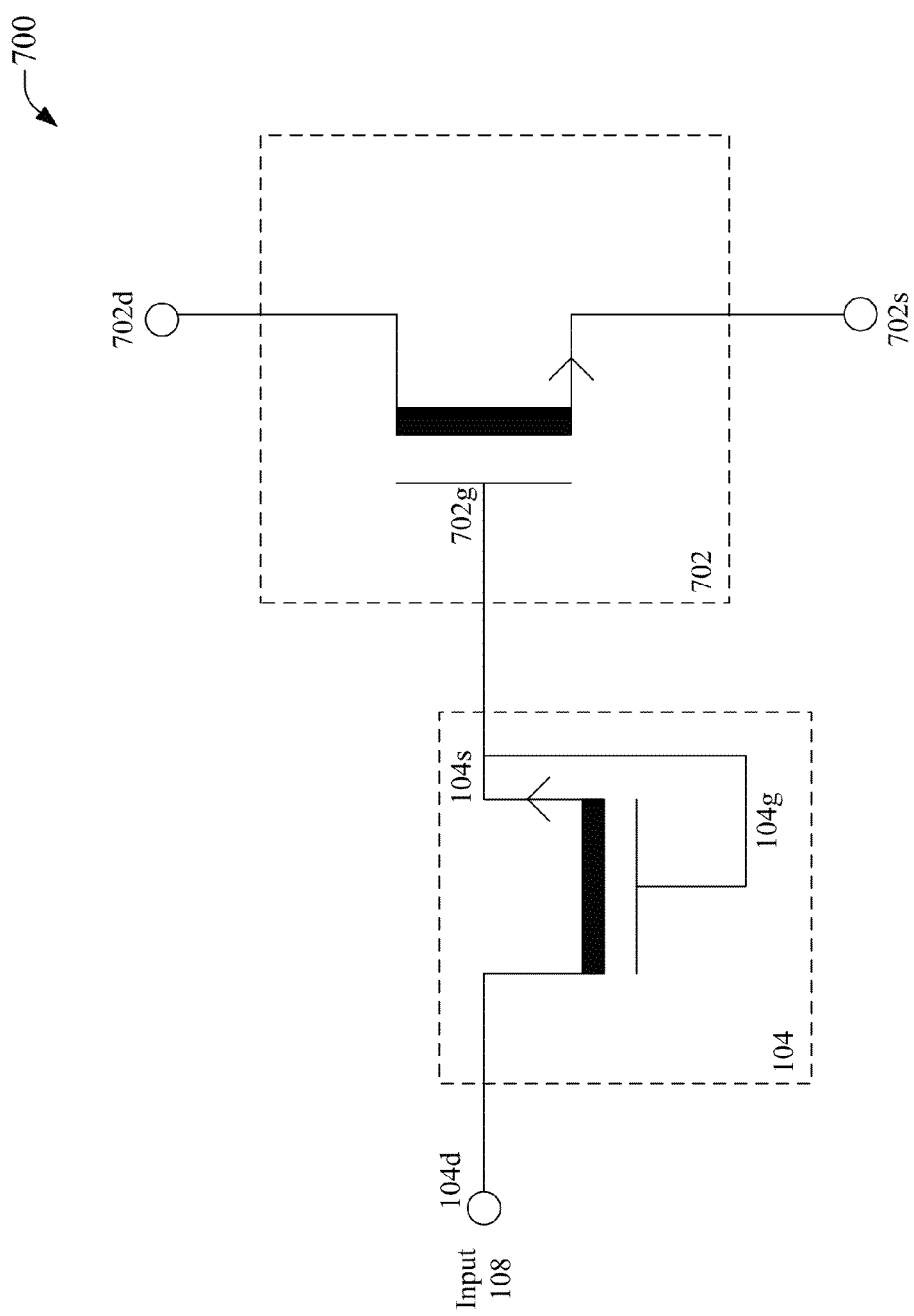
FIG. 7 is another example non-limiting schematic circuit diagram of a system that facilitates protection of a semiconductor device from overdrive, according to an aspect or embodiment of the subject disclosure.

Referring now to FIG. 7, illustrated is another example non-limiting schematic circuit diagram of a system 700 that facilitates protection of a semiconductor device from overdrive. In this case, the semiconductor device 702 can be a D-HEMT, rather than an E-HEMT, as described above. Semiconductor device 104 is still a bootstrapped D-HEMT. The source electrode 104s of the bootstrapped (gate 104g-source 104s tied-up) D-HEMT is connected to the gate terminal 702g of the D-HEMT 702. In an embodiment semiconductor devices 104 and 702 can be implemented on the same nitride semiconductor materials.

The input gate voltage 108 is applied at the drain electrode 104d of bootstrapped D-HEMT 104. The bootstrapped D-HEMT 104 acts as variable resistor to control the gate voltage at the gate electrode 702g of D-HEMT 702 below the critical value for reliable and safe operation. The source electrode of the bootstrapped D-HEMT is embedded into the gate electrode of the high voltage power D-HEMT 702, delivering gate overdrive immunity and improved on-state reliability. The bootstrapped D-HEMT has the same size constraints as described above with respect to FIGS. 1-2.

Figure 8:
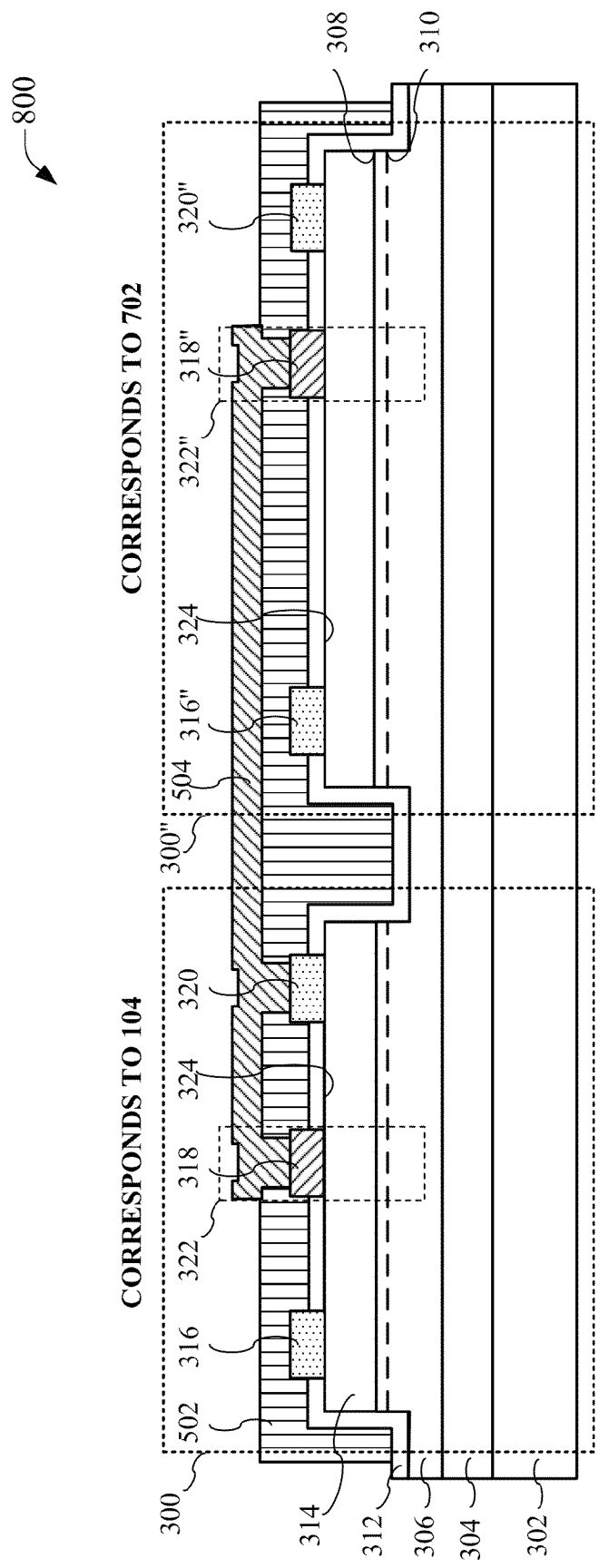
FIG. 8 is an example non-limiting schematic cross-section of a system employing the system illustrated in the circuit diagram of FIG. 7, according to an aspect or embodiment of the subject disclosure.

FIG. 8 is an example non-limiting schematic cross-section 800 of a system employing the system 700 illustrated in the circuit diagram of FIG. 7. A nitride material buffer layer 304 is formed on a substrate layer 302. The substrate layer 302 can be made of Si, SiC, Sapphire or GaN. A nitride semiconductor channel layer 306, such as GaN, is formed on the buffer layer 304. A nitride semiconductor barrier layer 314, such as $Al_xGa_{1-x}N$ ($0<X\le1$), is formed on the semiconductor layer 306.

A passivation or protection layer 312, such as SiN, is formed on the semiconductor barrier layer 314. A polarization charge is generated by spontaneous and piezoelectric polarization of the nitride semiconductor material, at an interface 308 at the boundary between semiconductor layer 306 and semiconductor barrier layer 312. As a result of the polarization charge, a two dimensional electron gas (2DEG) 310 forms in the vicinity between semiconductor 306 and semiconductor barrier layer 314.

Drain Ohmic contacts 316 and 316", source Ohmic contacts 320 and 320", along with the gate electrodes 318 and 318", are formed on the primary surface 324 of semiconductor barrier layer 314. An Ohmic contact is formed to the underlying semiconductor layer 314 (and hence underlying 2DEG 310), such as by metal stack Ti/Al/Ni/Au (or Ti/Al/Ti/Au, or the like) and thermal annealing. A Schottky contact is formed on the primary surface 324 of semiconductor barrier layer 314, such as by metal stack Ni/Au. Under the Schottky contact electrodes 318 and 318" of the regions 322 and 322" respectively, the 2DEG exists, forming a normally-on channel section.

Electrical insulation layer 502, such as polyimide, is formed on top of layer 312. Interconnect metal 504, such as by metal stack Ni/Au (or Au, or the like), is formed on top of the insulation layer 502 and electrically connects the electrodes 320, 318 and 318" in the same way as the connections in FIG. 7.

Figure 9:
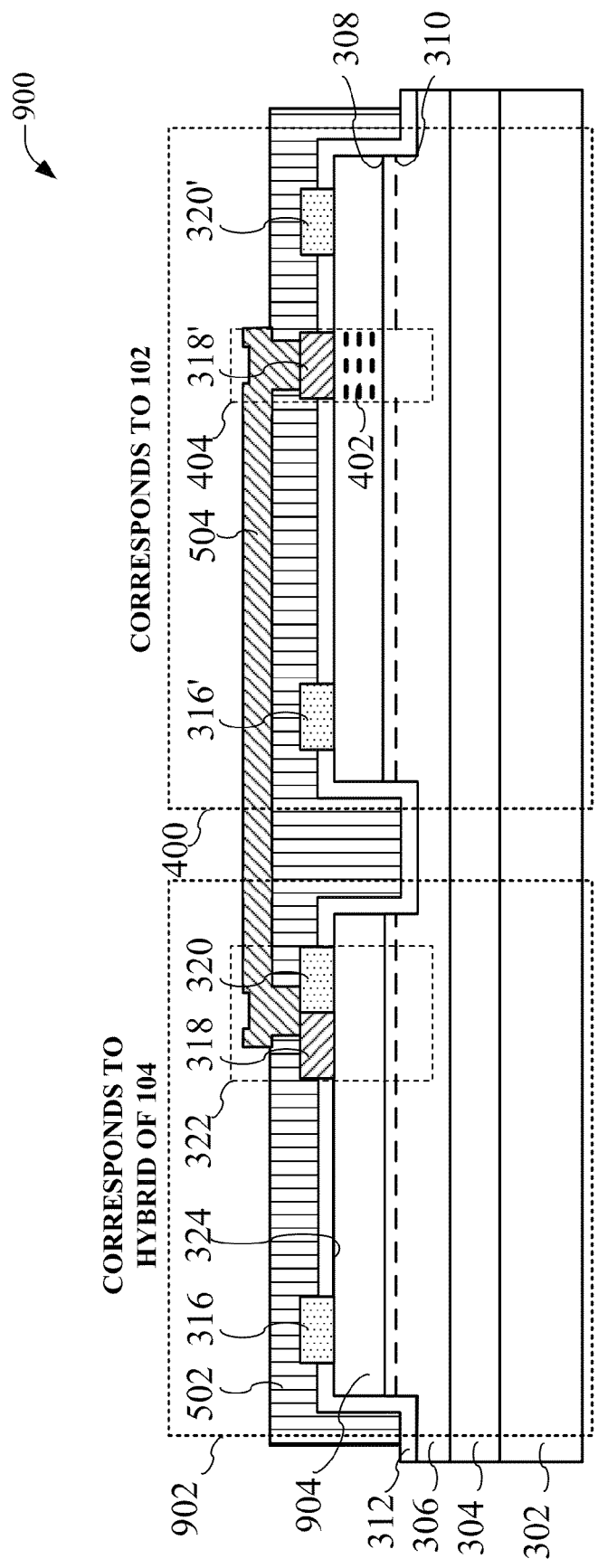
FIG. 9 is an example non-limiting schematic cross-section of a system employing the illustrated in the circuit diagram of FIG. 2 with a different structure than the cross-section of FIG. 5, according to an aspect or embodiment of the subject disclosure.

Since the bootstrapped D-HEMT 104 is effectively a two terminal device, the electrically shorted Schottky gate and Ohmic source electrodes 318 and 320 can be combined together to form a hybrid cathode electrode, as shown in FIG. 9. FIG. 9 is an example non-limiting schematic cross-section of a system employing the illustrated in the circuit diagram of FIG. 2 with a different structure than the cross-section of FIG. 5. FIG. 9 includes an Ohmic contact section under electrode 320 and a normally-on channel section with 2DEG under electrode 318. This modifies the structure of 104 to device 902. Device 902 operates the same function as the bootstrapped D-HEMT 104, with the same I-V characteristics (as in FIG. 14). The device 902 can be embedded to the gate electrode 318' of the power E-HEMT 102 for gate protection.

Figure 10:
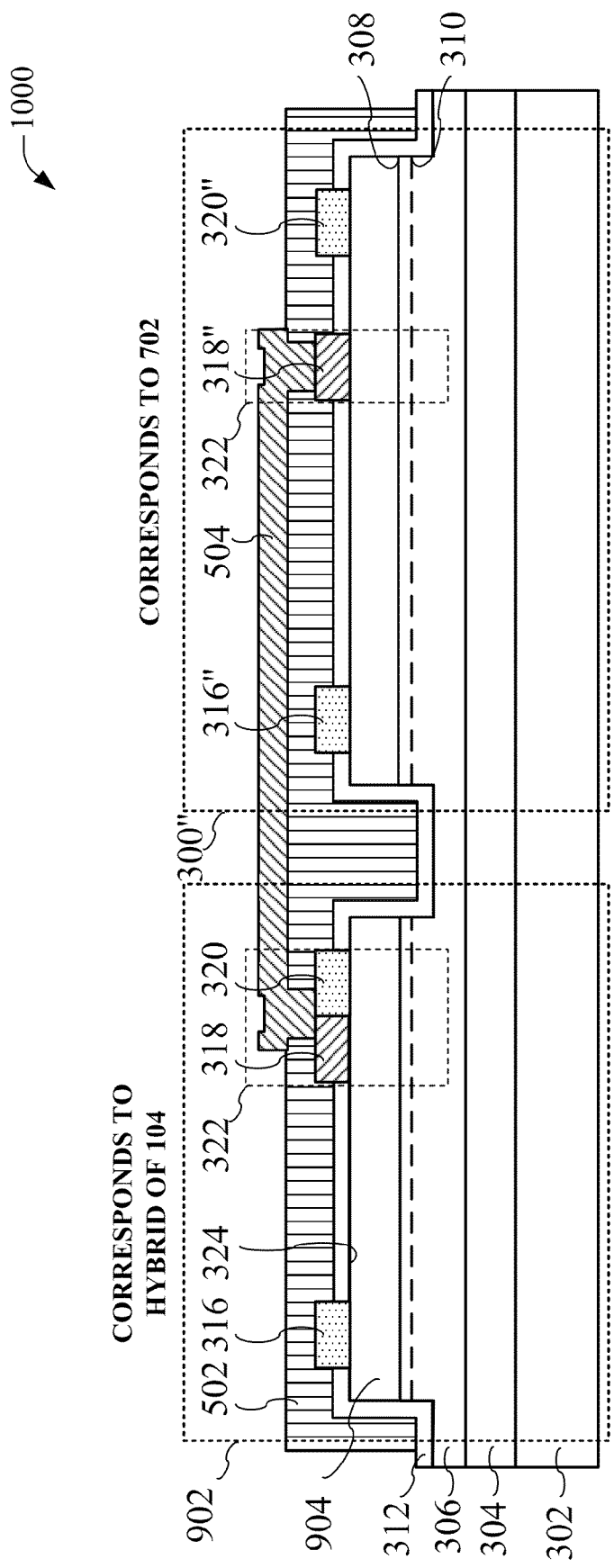
FIG. 10 is an example non-limiting schematic cross-section of a system employing the illustrated in the circuit diagram of FIG. 7 with a different structure than the cross-section of FIG. 8, according to an aspect or embodiment of the subject disclosure.

Referring now to FIG. 10, illustrated is an example non-limiting schematic cross-section 1000 of a system employing the illustrated in the circuit diagram of FIG. 7 with a different structure than the cross-section 800 of FIG. 8. The device 902 with a hybrid cathode electrode can be embedded into the gate electrode 318" of high voltage power D-HEMT 702 for gate overdrive immunity. Under the Schottky contact electrode of the region 322, the 2DEG exists, forming a normally-on channel selection of D-HEMT 702.

Figure 11:
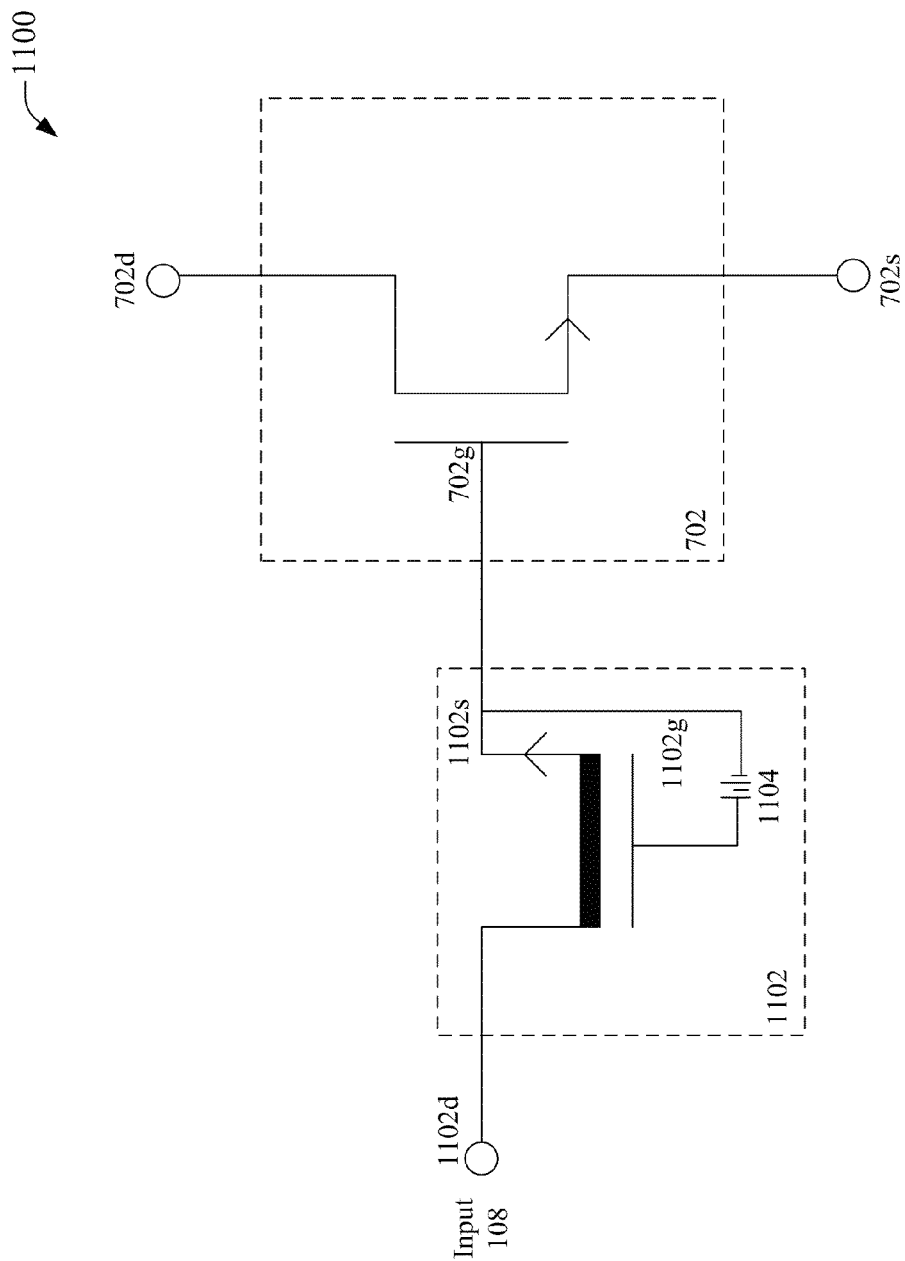
FIG. 11 is an example non-limiting schematic circuit diagram with an externally biased gate protected semiconductor device, according to an aspect or embodiment of the subject disclosure.

In the case of increasing temperature, Schottky gate current of semiconductor device 102 increases due to the property of thermionic emission, and the saturation current of protection D-HEMT 104 decreases due to the increased phonon scattering. Referring now to FIG. 11, illustrated is an example non-limiting schematic circuit diagram 1100 with an externally biased gate protected semiconductor device. The circuit configuration with a biased protection D-HEMT 1102 provides a flexibility to maximize the driving drain current while the gate bias across the Schottky gate 702g of 702 is still below the critical voltage, the effect of increasing temperatures can be disregarded.

Figure 12:
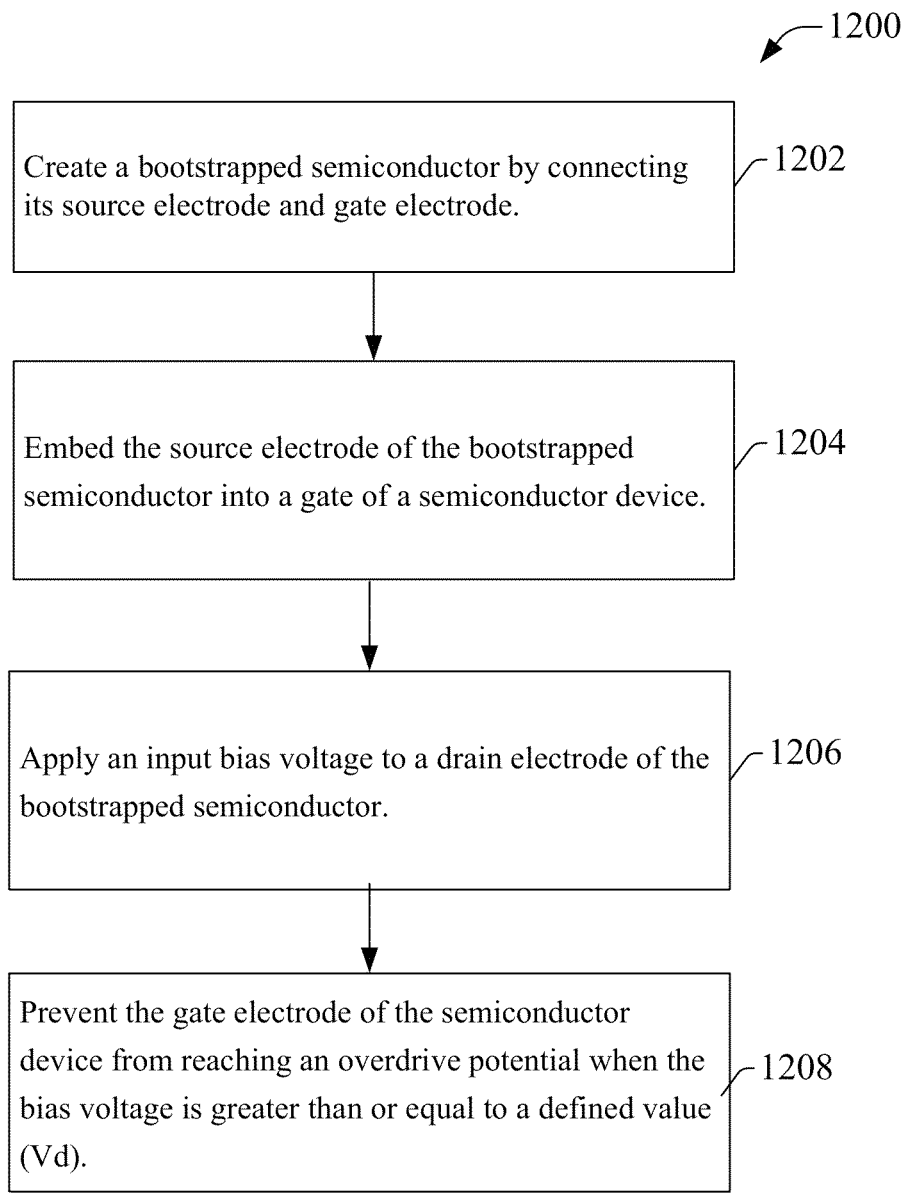
FIG. 12 is an example non-limiting process flow diagram of a method that facilitates protection of a semiconductor device from overdrive, according to an aspect or embodiment of the subject disclosure.
Figure 13:
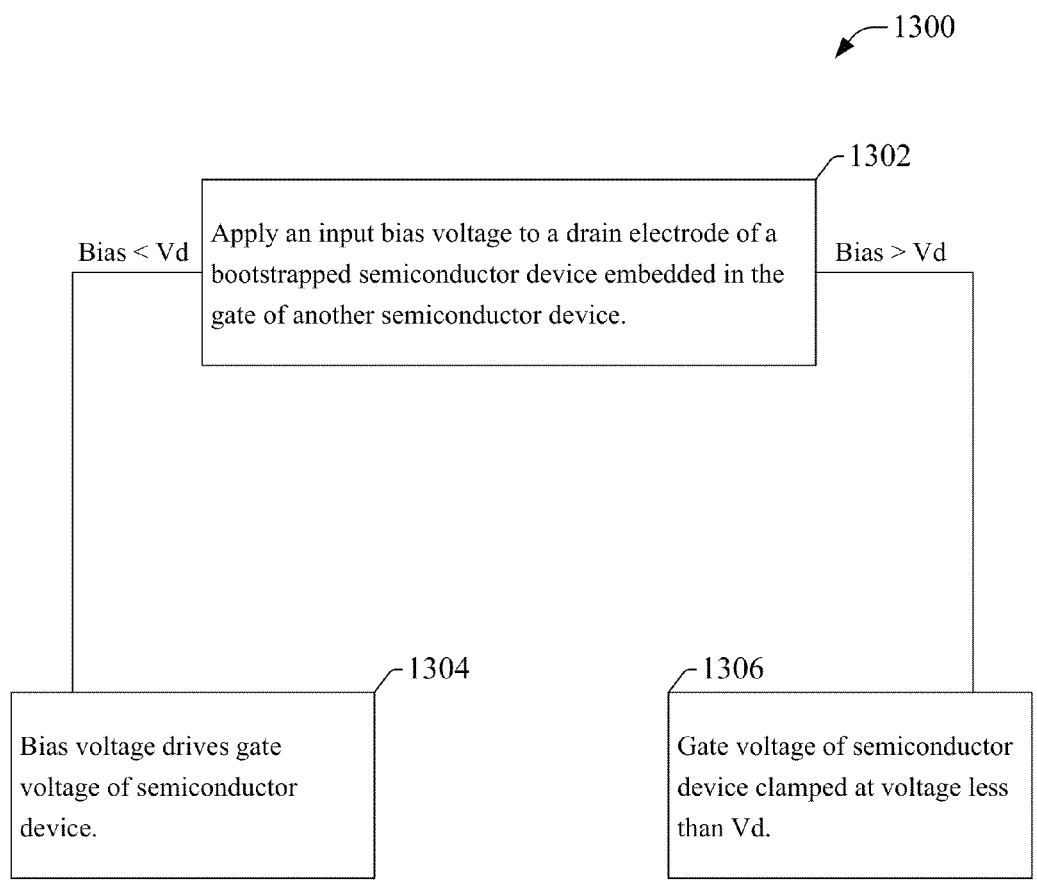
FIG. 13 is an example non-limiting process flow diagram of a method for protecting a semiconductor device according to the bias voltage, according to an aspect or embodiment of the subject disclosure.

FIGS. 12-13 illustrate methods 1200-1300 that facilitate gate overdrive protection to a semiconductor device. For simplicity of explanation, the methods (or procedures) are depicted and described as a series of acts. It is to be understood and appreciated that the various embodiments are not limited by the acts illustrated and/or by the order of acts. For example, acts can occur in various orders and/or concurrently, and with other acts not presented or described herein.

Referring now to FIG. 12, illustrated is an example non-limiting process flow diagram of a method 1200 that facilitates protection of a semiconductor device from overdrive. The overdrive can be prevented due to a bootstrapped semiconductor device embedded in a gate of another semiconductor device that acts as a variable resistor such that at a certain voltage, the semiconductor device only sees a value less than the a critical value and at voltages less than the certain voltage, the semiconductor device can be driven by the input voltage.

At element 1202, a bootstrapped semiconductor is created by connecting a source electrode and a gate electrode. At 1204, the source electrode of the bootstrapped semiconductor is embedded into the gate of a semiconductor device. At element 1206, an input bias voltage is applied to the drain electrode of the bootstrapped semiconductor. At 1208, the gate electrode of the semiconductor device is prevented from reaching an overdrive potential when the bias voltage is greater than or equal to a defined value (Vd).

The bootstrapped semiconductor device acts as a variable resistor in response to the input bias voltage. When the input bias voltage is below a critical value (a voltage value at which the semiconductor device has safe and reliable operation), the current at the gate of the semiconductor is below the saturation current of the bootstrapped semiconductor. In turn, the bootstrapped semiconductor exhibits low resistance such that the input bias voltage can directly drive semiconductor device. When the input bias voltage is above the critical value, the gate current of the gate electrode of the semiconductor device is clamped by the saturation current of the bootstrapped semiconductor, which exhibits a very large resistance. Once the gate saturation current is reached, any increase in input bias voltage will be absorbed by the bootstrapped semiconductor, allowing the gate voltage of the semiconductor device to be maintained just below the critical value. Thus, the gate electrode of the semiconductor device is guaranteed to be reliable and in safe operation. Limiting the gate voltage of the semiconductor device below the critical value can easily be achieved, for example, by adjusting the channel width of the bootstrapped semiconductor device, which is far smaller than the semiconductor device. When the bootstrapped semiconductor is far smaller than the semiconductor device, the bootstrapped semiconductor does not cause a significant increase of the active device area and the corresponding specific on-resistance.

Referring now to FIG. 13, illustrated is an example non-limiting process flow diagram of a method 1300 for protecting a semiconductor device according to the bias voltage. At element 1302, an input bias voltage is applied to a drain electrode of a bootstrapped semiconductor device embedded in a gate of a semiconductor device. When the bias voltage is less than a critical value (defined voltage Vd), at element 1304, the bias voltage can drive the gate voltage of the semiconductor device. When the bias voltage is greater than the critical value (defined voltage Vd), at element 1306, the gate voltage of the semiconductor device can be clamped at a voltage less than the critical value. The clamped voltage can be based on the saturation current of the bootstrapped semiconductor device.

As an example, Vd is at least about 1 V. In another example, Vd can be at least 2 V. In a further example, Vd is greater than 2.5 V. It will be understood that these examples are not meant to be limiting. Vd is determined based on the type of semiconductor device (e.g., semiconductor device 102) and the corresponding voltage requirements for operation.

EXPERIMENTAL

Experimental results showing the feasibility of providing gate overdrive protection to a semiconductor device by embedding a gate-voltage-controlling transistor to the gate electrode of the semiconductor device via an integrated AlGaN/GaN gate-protected HEMT. Schottky gate AlGaN/GaN HEMTs, especially Enhancement-mode HEMTs with positive threshold voltage, often feature small input gate voltage swing due to the small difference between the Schottky gate forward voltage ($V_F$), and the threshold voltage ($V_{th}$). In power switch applications, low on-resistance ($R_{on}$) and high drain current ($I_D$) for driving the output load are highly preferred during the ON-state of the switching cycle. To achieve these, the gate electrode may be biased temperately near to $V_F$. For example, at the Schottky gate of the E-mode HEMT fabricated by a fluorine plasma treatment technique, when the gate bias accidentally exceeds a value higher than $V_F$ during the switching transient to the ON-state, large numbers of hot electrons could be injected into the Schottky junction, causing the impact ionization to fluorine ions and the subsequent formation of stable Ga—F bonds, which in turn result in reduced number of the negatively charged fluorine ions. As a result, gate overdrive could lead to a permanent negative shift of the $V_{th}$. In addition, gate overdrive is usually accompanied by excessive gate current that could lead to device failure. The AlGaN/GaN HEMT with integrated gate protection capability can avoid the reliability issues at high gate bias, by embedding a small bootstrapped (with gate-source tied up) D-mode HEMT into the gate electrode of a high-voltage E-mode HEMT.

The D-mode HEMT can clamp the gate current to the saturation current of the D-mode HEMT. The voltage at the Schottky gate of the E-mode power HEMT is clamped at 2.45 V even when the input gate bias ($V_{In-S}$) to the integrated device increases to 20 V, with the extra voltage absorbed by the D-mode HEMT. The gate bias $V_{GS}$ below a critical voltage of 2.5V is found safe to the device at the ON-state operation without degradation. Such a protection scheme is fully compatible with the GaN smart power platform featuring monolithic integration of E/D-mode HEMTs. The wide input gate bias range also facilitates simple connections between gate driver circuits and the power switches by eliminating the level shifter circuits required for conventional GaN Schottky gate power HEMTs.

Accordingly, as shown below, the proposed scheme of the integrated AlGaN/GaN gate-protected HEMT can tolerate a high voltage swing that exceeds 20V at the input gate, with enhanced safety (e.g., no gate failure) and improved reliability (e.g., no shift in threshold voltage), while yielding no penalties to the ON-state current and OFF-state breakdown voltage. The results obtained for the integrated AlGaN/GaN gate-protected HEMT is not limited to GaN-based devices, and can be extended to other semiconductor devices, including other group III-N heterojunction devices.

Subject Semiconductor Device

The experiments were carried out on a 4-inch GaN-on-Si wafer featuring a 1.8 μm GaN buffer and a 20 nm barrier layer (including 1-nm AlN, 17-nm AlGaN and 2-nm GaN cap). E-mode and D-mode HEMTs were fabricated within the semiconductor according to fluorine plasma ion implant technique.

Enhancement Mode HEMT (E-mode HEMT, EHEMT or E-HEMT)

The E-HEMT is similar to element 102 that is schematically illustrated in FIG. 2. The E-mode HEMT used in this experiment exhibited a gate length $L_g$ of 1.5 µm, a gate-drain distance $L_{gd}$ of 10 µm, a gate-source distance $L_{gs}$ of 2 µm, and a gate width $W_g$ of 100 µm. It will be understood that although an E-mode HEMT was gate protected and tested in these experiments, the results should also apply to D-mode HEMT devices that are gate protected.

Depletion Mode HEMT (D-mode HEMT, DHEMT or D-HEMT)

The D-mode HEMT was bootstrapped with the gate and source tied up (or connected in series). The gate-source tied-up D-HEMT is similar to element 104 that is schematically illustrated in FIG. 2. The D-mode HEMT used in this experiment exhibited an $L_g$=1.5 µm, an $L_{gd}$=2 µm, an $L_{gs}$=2 µm, and a $W_g$=5 µm.

Gate Protection

The gate protection is set up similarly to the circuit in FIG. 2. The input voltage is delivered to the D-HEMT, which can protect the E-HEMT from voltages higher than the threshold voltage for the D-HEMT. The gate protected circuit is referred to as the integrated HEMT and the HEMT with gate protection. The results achieved with the integrated HEMT were compared to the results achieved with a HEMT without gate protection.

Labels at the Nodes of the Gate Protected Device

To aid the explanation of the experimental details, labels are added to the nodes of the device 200 of FIG. 2. The input 108 is labeled as "In". The node connecting electrodes 104s, 104g and 102g is labeled as "G". The node at the electrode 102d is labeled as "D" and the electrode 102s as "S". The same labeling is applied to 700 of FIG. 7. For example, the voltage applied across the input 108 "In" and the source 102s "S" is abbreviated as $V_{In-S}$, while the voltage measured across the node "G" and the node at the source 102s "S" is called $V_{GS}$. The measured current through the node "D" is called $I_D$. Similar nomenclature is applied to the voltage across and current through other nodes.

D-HEMT as Variable Resistor

Figure 14:
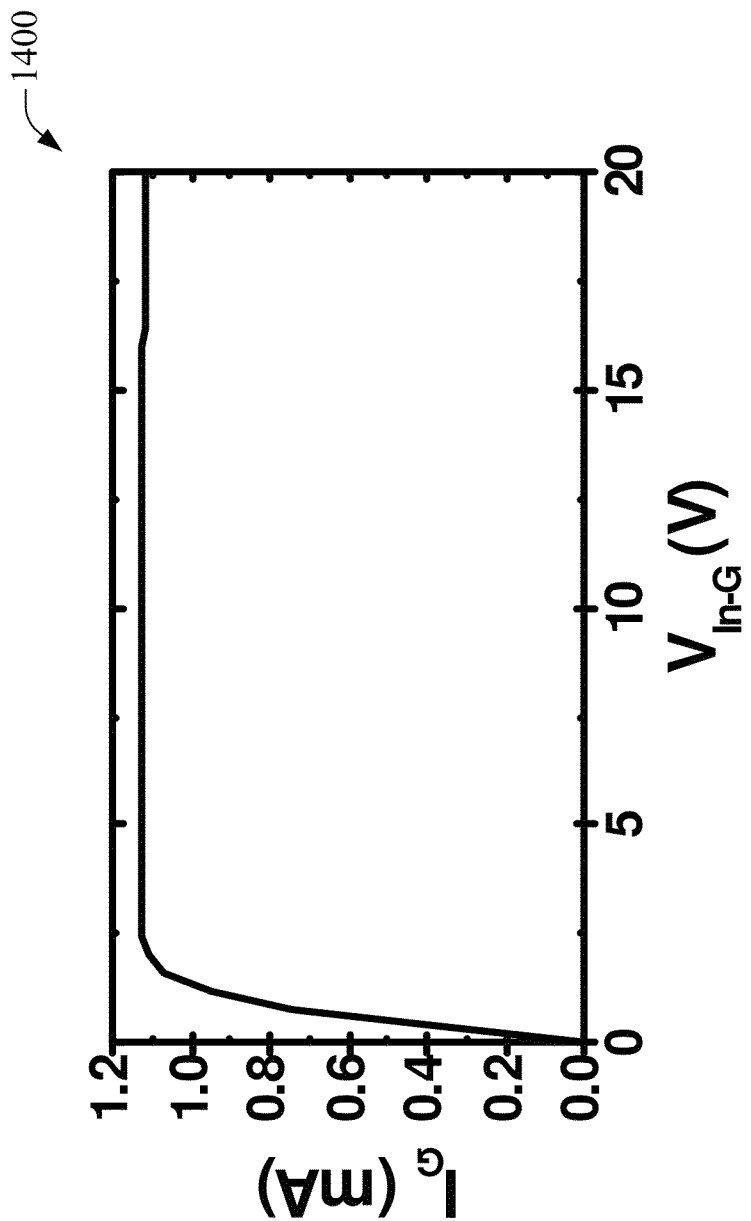
FIG. 14 is an example non-limiting plot of a two-terminal I-V curve of a gate-source tied-up D-HEMT (similar to element 104 of FIG. 2), according to an aspect or embodiment of the subject disclosure.

The input voltage was delivered to the drain of the D-HEMT. FIG. 14 shows the two-terminal I-V curve 1400 of the gate-source tied up bootstrapped D-HEMT of 104 of FIG. 2 or FIG. 7. As the $V_{In-G}$ increases above a saturation voltage, the gate current remains about the same. The bootstrapped D-HEMT acts like a variable resistor, exhibiting a small resistance at a low current level of gate current $I_G$, and a large resistance at the saturation level. The saturation level as shown in FIG. 14 is about 1.1 mA. However, other saturation levels can be achieved with slight variations in the design of the D-HEMT.

Comparison Between Protected E-HEMT and Unprotected E-HEMT

Figure 15:
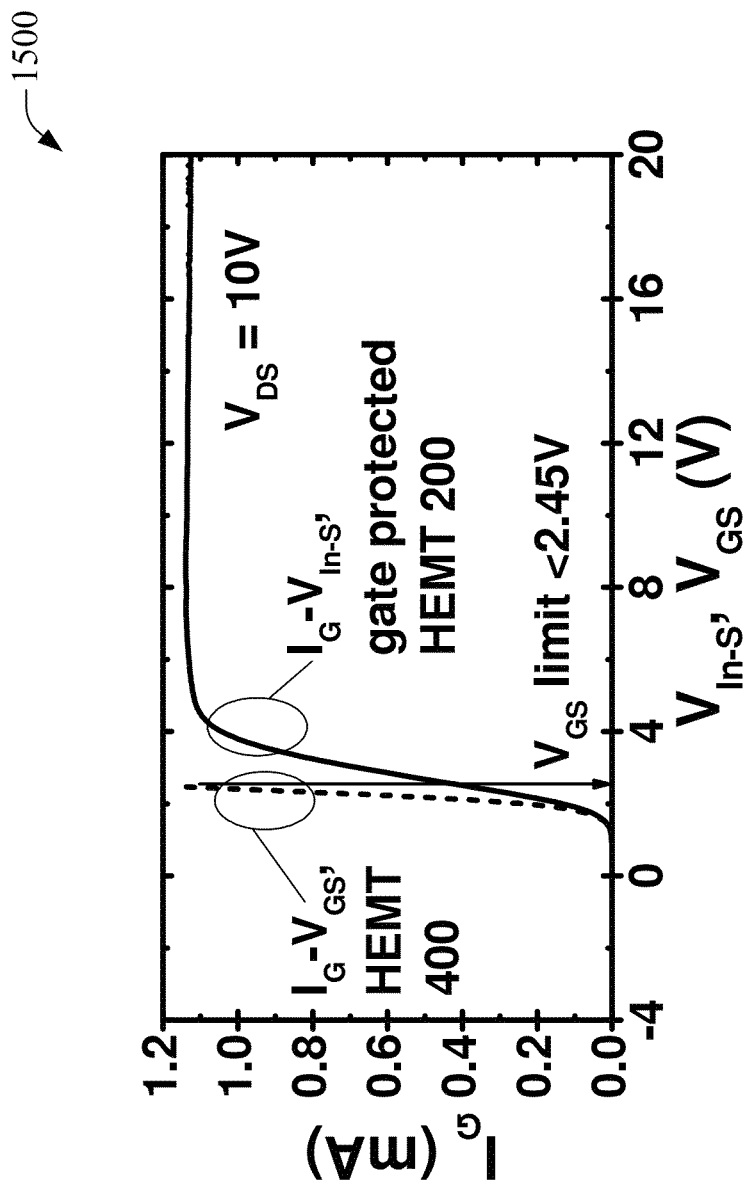
FIG. 15 is an example non-limiting plot illustrating how gate current limitation is achieved in a gate protected HEMT (similar to element 102 of FIG. 2) while the E-HEMT (e.g., similar to FIG. 4) without gate protection cannot be operated with high gate driving voltage, according to an aspect or embodiment of the subject disclosure.

FIG. 15 shows a plot 1500 that illustrates how gate current limitation is achieved in a gate protected HEMT (or integrated HEMT, similar to the device 200 of FIG. 2) compared to a E-HEMT (e.g., the conventional Schottky in a E-HEMT 400 similar to FIG. 4) without gate protection. As shown in FIG. 15, the E-HEMT without gate protection cannot be operated with high gate driving voltage due to a prohibitively high gate current, while the gate protected E-HEMT can operate at these voltages due to the protection provided by the D-HEMT.

The E-HEMT without gate protection exhibits an exponential relationship in which a small increase in gate voltage can result in an excessive gate voltage that can lead to device failure. By embedding the bootstrapped D-HEMT featuring the $I_G$-$V_{In-G}$ characteristics shown in FIG. 14 to the gate electrode of the E-HEMT, the gate current $I_G$ can be clamped to the saturation current of the D-HEMT. Once the saturation current is reached, any increase of the input bias voltage $V_{In-S}$ will be absorbed by the bootstrapped D-HEMT, and results in safe operation even when $V_{In-S}$ exceeds 20V.

Protection Capabilities of D-HEMT

Figure 16:
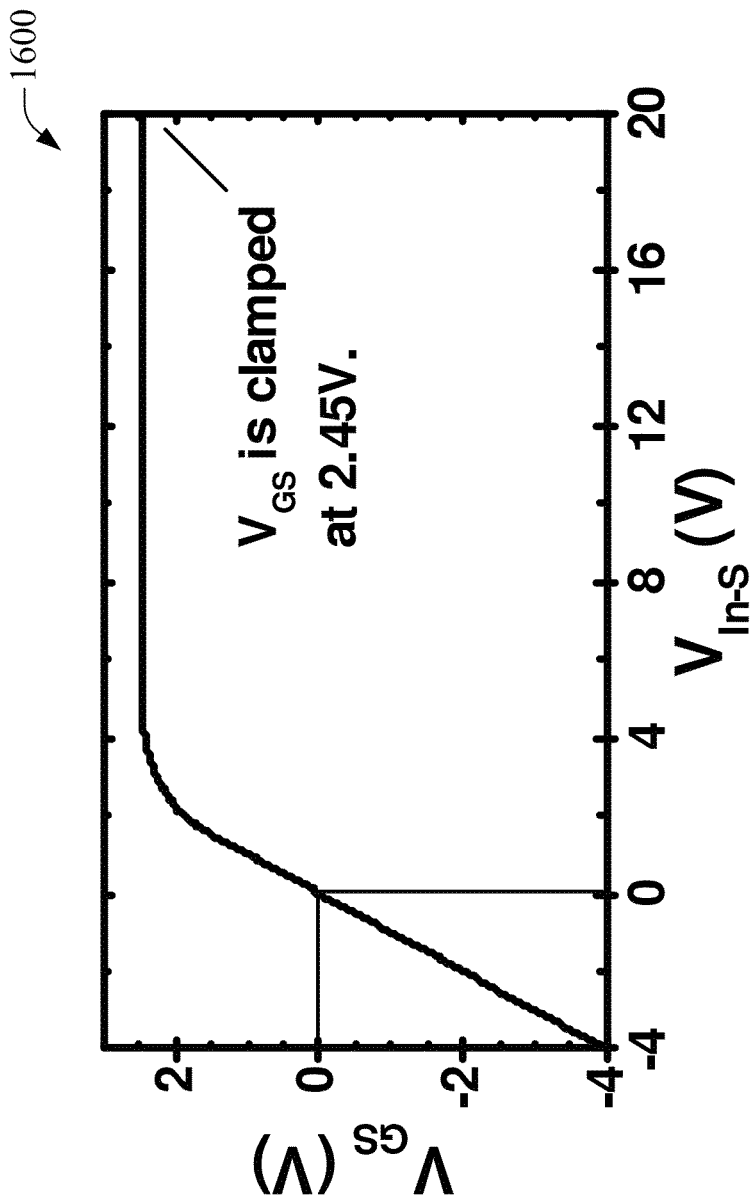
FIG. 16 is an example non-limiting plot showing the gate-source voltage ($V_{GS}$) of a gate protected E-HEMT (similar to element 102 of FIG. 2) as a function of the input gate bias ($V_{IN-S}$), according to an aspect or embodiment of the subject disclosure.

The D-HEMT can be utilized to protect the gate of the E-HEMT from high voltages, as shown in FIG. 16 due at least in part to the variable resistor qualities of the D-HEMT. After applying the gate protection technique, as shown in FIG. 16, when the input voltage is higher than the threshold voltage for the D-HEMT (1.1 mA, as shown in FIG. 14), the $V_{GS}$ for the E-HEMT is clamped at 2.45 V, which is below the critical value of 2.5 V, even when the input bias $V_{In-S}$ is increased to 20V. The gate bias $V_{GS}$ below the critical value was found to be safe and reliable in operation with no threshold voltage shift to the E-HEMT during ON-state operation.

DC Output and Transfer Characteristics

Figure 17:
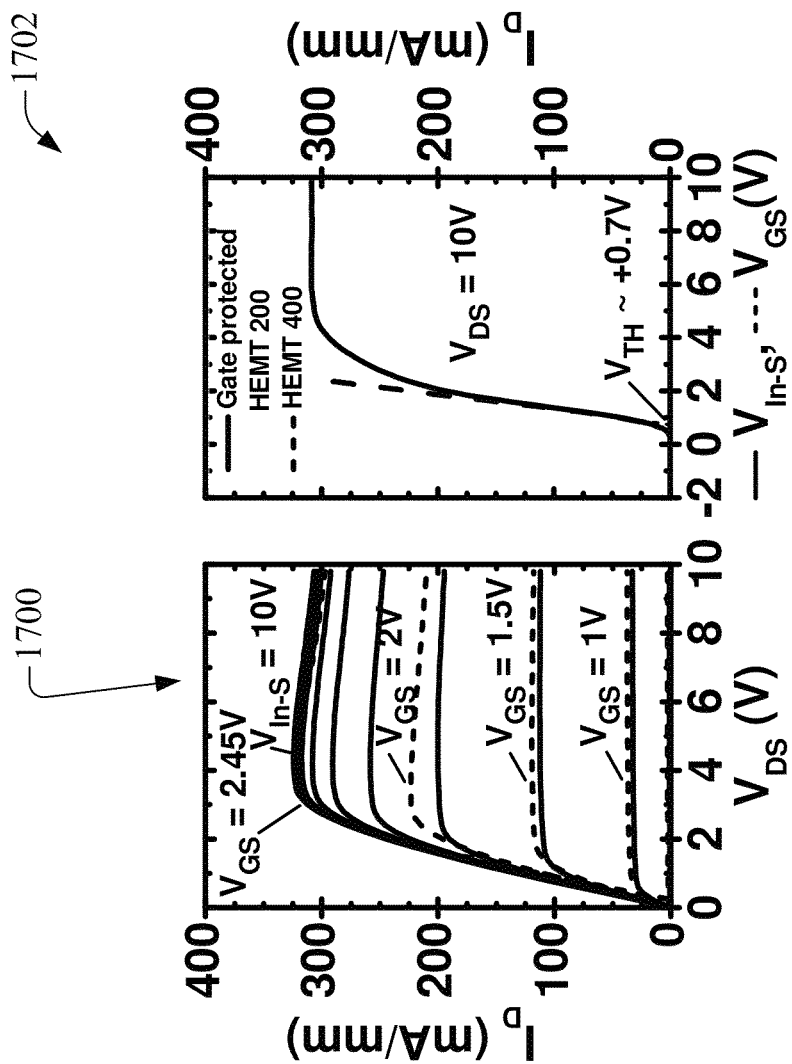
FIG. 17 is an example non-limiting plot showing the DC output ($I_D$-$V_{DS}$) and transfer ($I_D$-$V_{GS}$) characteristics of the unprotected E-HMT (e.g., similar to FIG. 4) and the gate protected E-HEMT (similar to element 102 of FIG. 2), according to an aspect or embodiment of the subject disclosure.

FIG. 17 illustrates the DC output ($I_D$-$V_{DS}$) 1700 and transfer ($I_D$-$V_{GS}$) 1702 characteristics of the unprotected E-HEMT (e.g., similar to the device 400 of FIG. 4) and the gate protected E-HEMT (similar to the device 200 of FIG. 2). In the transfer characteristics, both the gate-protected E-HEMT and the conventional unprotected E-HEMT show the same threshold voltage $V_{TH}$ as +0.7V. The conventional unprotected E-HEMT has a saturation drain current $I_D$ of typically around 310 mA/mm when $V_{GS}$ is 2.45V. With gate-protection, the integrated device exhibits an $I_D$ close to the conventional counterpart when input bias $V_{In-S}$ is below 1.5V. When $V_{In-S}$ is above 2.5V, $I_D$ starts to saturate and remains at 310 mA/mm when $V_{In-S}$ continues to increase. In the output characteristics, the gate-protected E-HEMT shows a specific on-resistance ($R_{ON,SP}$) of 1.5 mΩ-cm$^2$ (including the effective active region of the bootstrapped D-HEMT), which is close to the conventional unprotected E-HEMT (1.24 mΩ-cm$^2$).

OFF-State Properties

Figure 18:
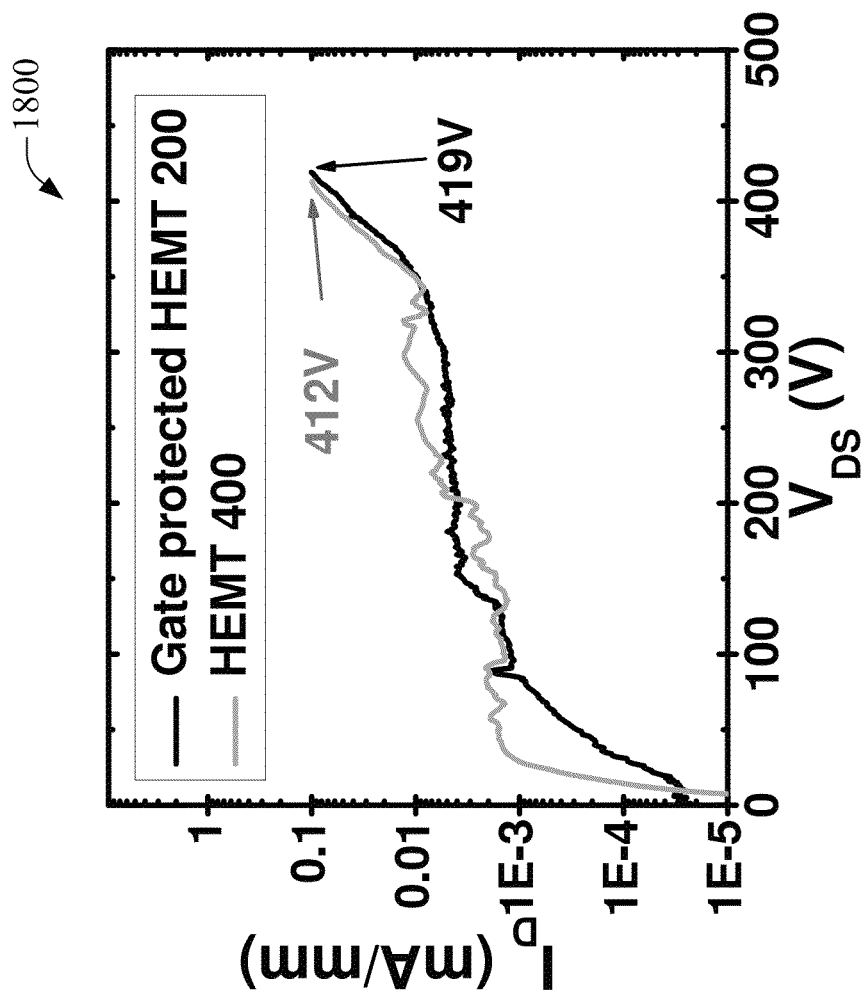
FIG. 18 is an example non-limiting plot illustrating the OFF-state leakage current of the unprotected E-HMT (e.g., similar to FIG. 4) and the gate protected E-HEMT (similar to element 102 of FIG. 2), according to an aspect or embodiment of the subject disclosure.

FIG. 18 illustrates the OFF-state leakage current of the conventional unprotected E-HEMT and the gate-protected E-HEMT. The OFF-state breakdown voltage is measured to be at 419 (at a drain current density of 0.1 mA/mm) in the gate-protected E-HEMT, showing no degradation as compared to the conventional unprotected E-HEMT (421V). Accordingly, no penalty on the off-state breakdown voltage of the gate protected E-HEMT is observed when it is compared to the conventional E-mode HEMT.

ON-State Reliability

Figure 19:
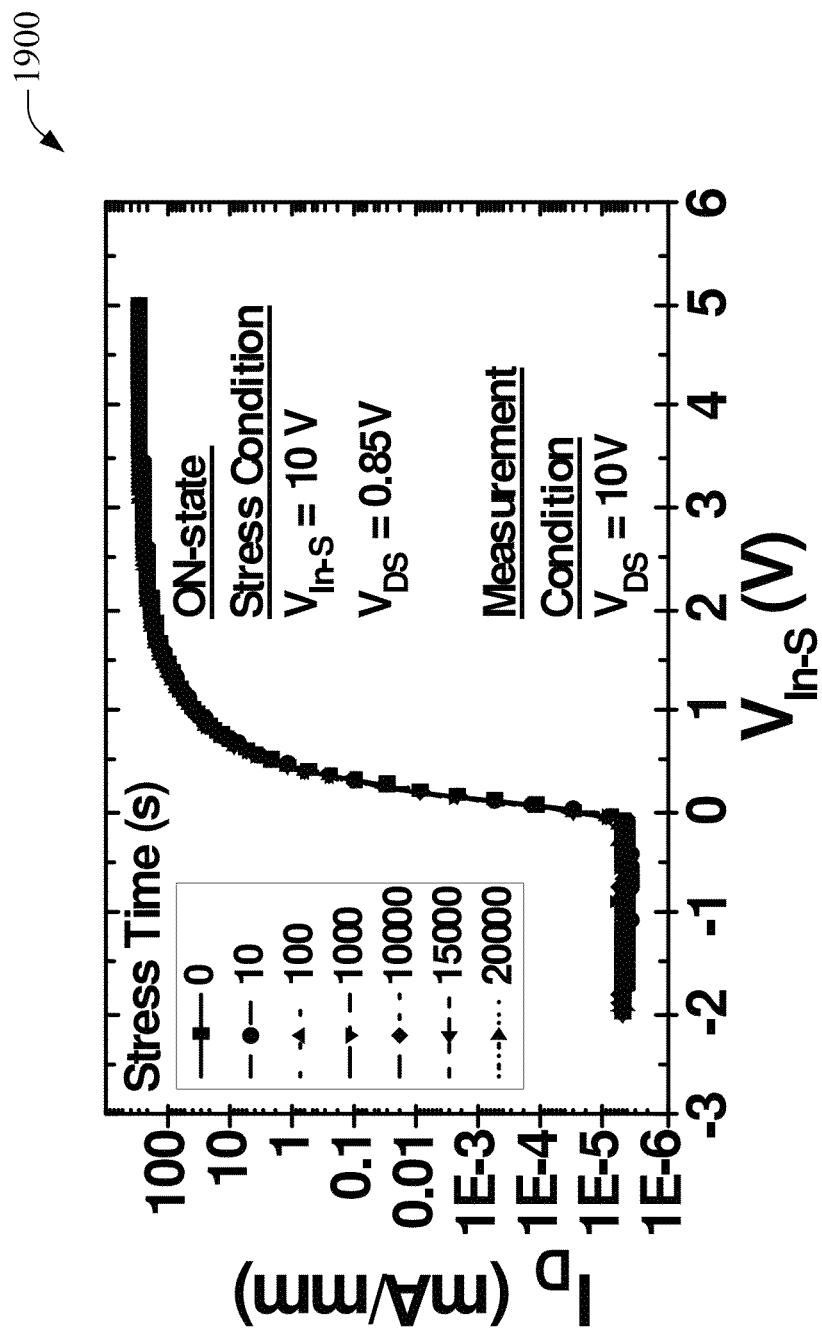
FIG. 19 is an example non-limiting plot illustrating the transfer ($I_D$-$V_{In-S}$) curves measured after ON-state stresses, according to an aspect or embodiment of the subject disclosure.

The fabricated chip with gate-protected E-HEMT was also undergone an ON-state electrical stress test, as shown in FIG. 19. The input bias $V_{In-S}$ was driven by a 10V constant input and $V_{DS}$ was biased at 0.85V, such that the drain current $I_D$ was kept at an ON-state current of ~110 mA/mm during the stress. The bootstrapped D-HEMT effectively absorbs the extra gate overdrive.

Figure 20:
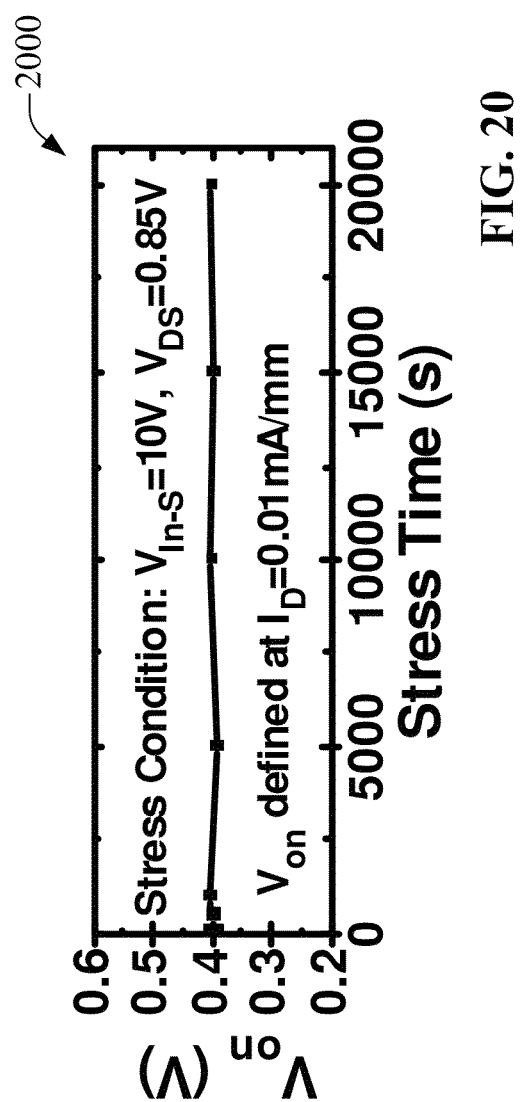
FIG. 20 is an example non-limiting plot of $V_{ON}$ for various ON-state stress times, according to an aspect or embodiment of the subject disclosure.

As shown in FIG. 20, the gate of the integrated E-HEMT remains safe in operation with excellent threshold voltage stability. As shown in FIG. 20, $V_{on}$ is stable, staying at about 0.4V. $V_{on}$ was defined as a channel turn-on voltage corresponding to the small sub-threshold drain current at 0.01 mA/mm.

Switching Test

Figure 21:
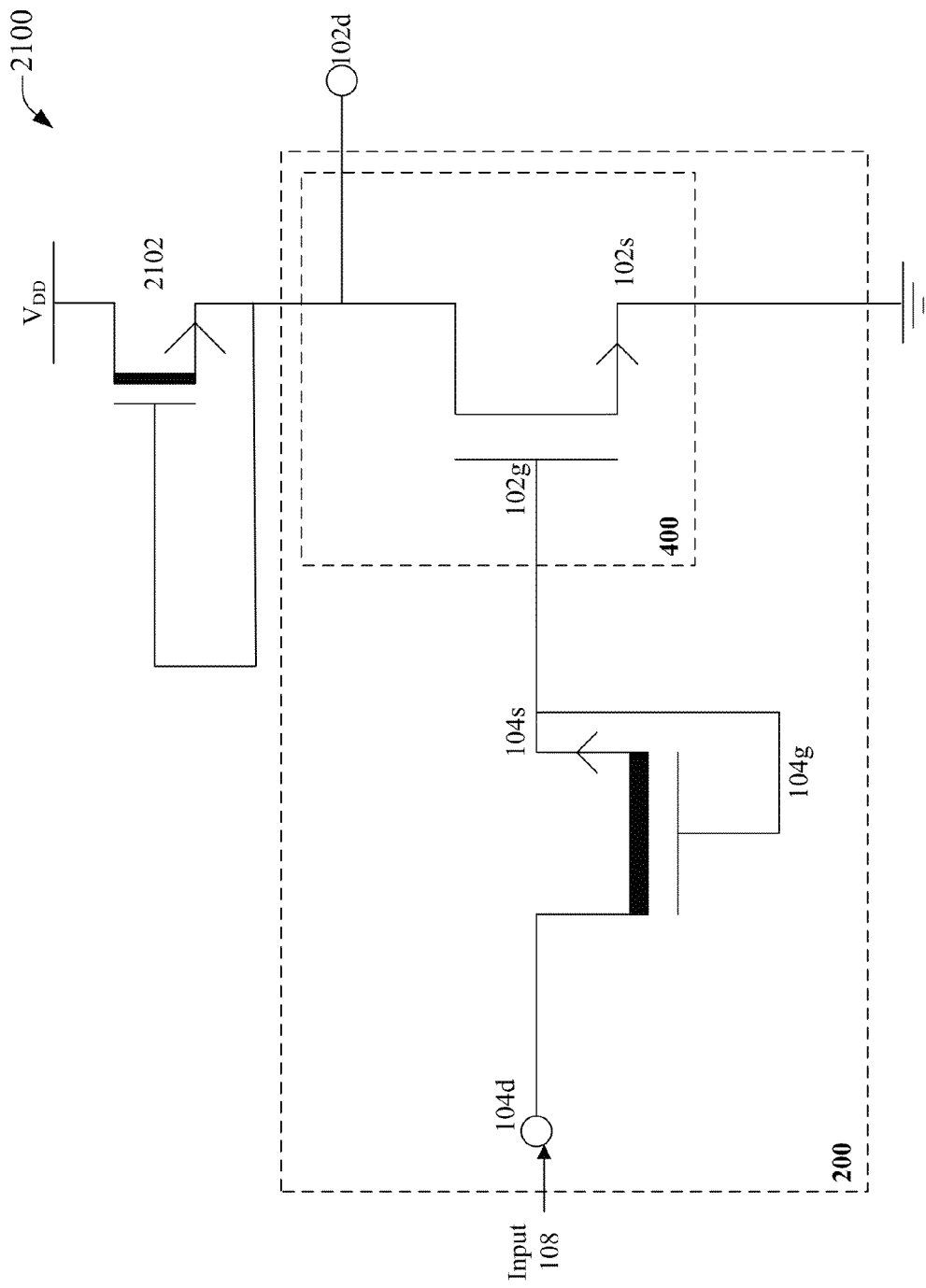
FIG. 21 is an example non-limiting schematic circuit diagram for an AC switch test of the gate protected E-HEMT and a non-gate protected E-HEMT, according to an aspect or embodiment of the subject disclosure.

To address the concern over the impact of the protection D-HEMT on the switching speed of the E-HEMT, FIG. 21 shows a circuit diagram 2100 of the experimental setup of the AC switching test of the conventional E-HEMT 400 and the gate-protected HEMT 200. A gate-source connected D-HEMT 2102 is added as an active load to convert the variation of drain current through the E-HEMT into voltage at the drain terminal 102*d*.

Figure 22:
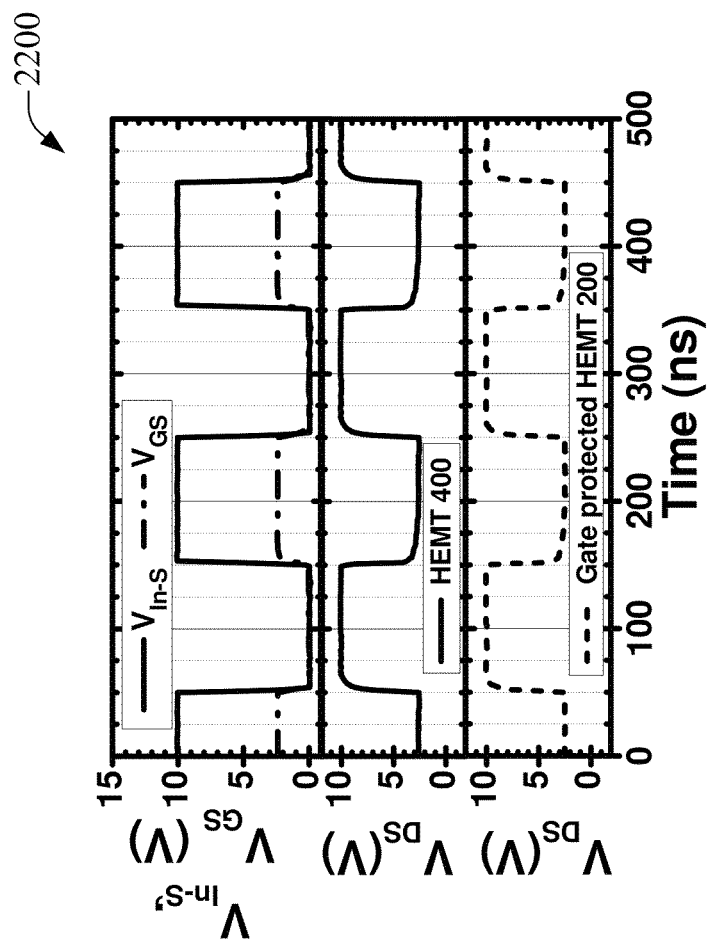
FIG. 22 is an example plot showing AC gate performance of an E-HEMT with gate protection in response to a 5 MHz input, according to an aspect or embodiment of the subject disclosure.

FIG. 22 shows the square waveform inputted to $V_{In-S}$. With gate-protection, the bootstrapped D-HEMT 2102 effectively absorbs the excess voltage of $V_{In-S}$, and $V_{GS}$ is clipped to a safe maximum operating voltage at 2.45V at gate terminal 104*g* of the E-HEMT 400. The integrated gate-protected HEMT 200 exhibits no degradation in the rise/fall times up to 5 MHz when it is compared with the same setup using conventional HEMT 400, which can only accept the peak amplitude of 2.45V for safe operation.

The above description of illustrated aspects and embodiments, including what is described in the Abstract, is not intended to be exhaustive or to limit the disclosed aspects and embodiments to the precise forms disclosed. While specific aspects and embodiments and examples are described herein for illustrative purposes, various modifications are possible that are considered within the scope of such aspects and embodiments and examples, as those skilled in the relevant art can recognize.

As used herein, the word "example" is used herein to mean serving as an example, instance, or illustration. For the avoidance of doubt, the subject matter described herein is not limited by such examples. In addition, any aspect or design described herein as an "example" is not necessarily to be construed as preferred or advantageous over other aspects or designs, nor is it meant to preclude equivalent structures and techniques known to those of ordinary skill in the art. Moreover, the experimental results are merely examples of a potential solution showing feasibility of the gate protection, and should not be construed to be a preferred solution. For example, it is contemplated and intended that the design described herein can be applied to other 2DEG type filed effect transistors. For clarity, the examples are based on single simple $Al_xGa_{1-x}N/GaN$ vertical layered heterostructure. However, an ordinary person in the art would know the variations to modify the design to make other combinations and forms of designs.

The terms "first," "second," "third," "fourth," and the like in the description and the claims, if any, may be used for distinguishing between similar elements and not necessarily for describing a particular sequential or chronological order. It is to be understood that the terms so used are interchangeable.

Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

With respect to any numerical range for a given characteristic, a parameter from one range may be combined with a parameter from a different range from the same characteristic to generate a numerical range. Other than where otherwise indicated, all numbers, values, and/or expressions referring to quantities of ingredients, reaction conditions, etc., used in the specification and claims are to be understood as modified in all instances by the term "about."

In this regard, while the described subject matter has been described in connection with various aspects and embodiments and corresponding Figures, where applicable, it is to be understood that other similar aspects and embodiments can be used or modifications and additions can be made to the described aspects and embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims.

What is claimed is:

1. An integrated group III-nitride device, comprising:
   an enhancement-mode high electron mobility transistor (E-HEMT) comprising a first source electrode, a first drain electrode and a first gate electrode; and
   a depletion-mode high electron mobility transistor (D-HEMT) comprising a second source electrode, a second drain electrode and a second gate electrode,
   wherein the first gate electrode is in series with the second source electrode,
   wherein the second gate electrode is connected to the second source electrode and the first gate electrode,
   wherein a gate voltage of the E-HEMT is driven by application of an input bias voltage to the second drain electrode, and
   wherein a current at the first gate electrode generated in response to the application of the input bias voltage to the second drain electrode is clamped at a saturation current of the D-HEMT.

2. The integrated group III-nitride device of claim 1, wherein a second size of the D-HEMT structure is smaller than a first size of the E-HEMT structure.

3. The integrated group III-nitride device of claim 1,
   wherein, in response to the input bias voltage being less than a defined voltage value, the current at the first gate electrode is equal to or less than the saturation current of the D-HEMT structure, and
   wherein, in response to the input bias voltage being greater than or equal to the defined voltage value, the current at the first gate electrode is equal to or less than the saturation current of the D-HEMT structure.

4. The integrated group III-nitride device of claim 1, wherein the first source electrode and the first drain electrode make Ohmic contacts to the E-HEMT structure, the first gate electrode has a Schottky barrier contact to the E-HEMT structure, the second source electrode and the second drain electrode make Ohmic contacts to the D-HEMT structure, and the second gate electrode has a Schottky barrier contact to the D-HEMT structure.

5. The integrated group III-nitride device of claim 1, wherein the E-HEMT structure comprises a first group III-nitride semiconductor device and the D-HEMT structure comprises a second group III-nitride semiconductor device.

6. A device, comprising:
   an enhancement-mode high electron mobility transistor (E-HEMT) comprising a first source electrode, a first drain electrode and a first gate electrode; and
   a depletion-mode high electron mobility transistor (D-HEMT) comprising a second source electrode, a second drain electrode and a second gate electrode,
   wherein the D-HEMT is connected to the first gate electrode of the E-HEMT in series via connection of the second gate electrode to the second source electrode and the first gate electrode.

7. The device of claim 6, wherein the second gate electrode comprises a Schottky barrier structure, and wherein the Schottky barrier structure comprises a Schottky barrier contact and a negative charge-trapped region on the second semiconductor substrate.

8. The device of claim 7, wherein the negative charge-trapped region comprises F ions.

9. The device of claim 6, wherein the E-HEMT and the D-HEMT are implemented on a same group-III nitride semiconductor material.

10. The device of claim 9, further comprising an isolation structure that separates the E-HEMT and the D-HEMT.

11. The device of claim 6, wherein a potential current at the first gate electrode of the E-HEMT generated in response to application of a bias voltage to the second drain electrode of the D-HEMT is clamped based on a saturation current of the D-HEMT.

12. A device, comprising:
 an E-HEMT comprising a first source electrode, a first drain electrode and a first gate electrode; and
 a D-HEMT comprising a second source electrode, a second drain electrode and a second gate electrode,
 wherein the first gate electrode is in series with the second source electrode,
 wherein the second gate electrode is connected to the second source electrode and the first gate electrode, and
 wherein an overdrive potential of the first gate electrode is controlled based on a saturation current of the D-HEMT when a bias voltage is applied to the second drain electrode.

13. The device of claim 12, wherein a potential current at the first gate electrode, generated in response to application of a bias voltage to the second drain electrode greater than or equal to a defined bias voltage, is less than or equal to the saturation current of the D-HEMT structure.

14. The device of claim 12, wherein the second semiconductor structure has a resistance that varies as a function of the bias voltage to facilitate the preventing the first gate electrode of the E-HEMT structure from reaching the overdrive potential.

15. The device of claim 12, wherein the E-HEMT structure is configured to receive a gate current in response to application of the bias voltage to the second drain electrode and wherein a potential gate voltage of the E-HEMT structure is clamped at a value less than or equal to the defined voltage value based on the saturation current of the D-HEMT structure.

16. The device of claim 15, wherein the defined voltage value is at least about 2 volts.

17. The device of claim 12, wherein the E-HEMT structure comprises a first vertical layered heterostructure and the D-HEMT structure comprises a second vertical layered heterostructure, and
 wherein the first vertical layered heterostructure and the second vertical layered heterostructure are implemented on a same group-III nitride semiconductor material.

\* \* \* \* \*